(12) United States Patent
Sriram et al.

(10) Patent No.: US 9,847,411 B2
(45) Date of Patent: Dec. 19, 2017

(54) RECESSED FIELD PLATE TRANSISTOR STRUCTURES

(71) Applicant: CREE, INC., Durham, NC (US)

(72) Inventors: Saptharishi Sriram, Cary, NC (US); Terry Alcorn, Cary, NC (US); Fabian Radulescu, Chapel Hill, NC (US); Scott Sheppard, Chapel Hill, NC (US)

(73) Assignee: CREE, INC., Durham, NC (US)

(*) Notice: Subject to any disclaimer, the term of this patent is extended or adjusted under 35 U.S.C. 154(b) by 0 days.

(21) Appl. No.: 13/929,487

(22) Filed: Jun. 27, 2013

(65) Prior Publication Data
US 2014/0361342 A1    Dec. 11, 2014

Related U.S. Application Data

(63) Continuation-in-part of application No. 13/913,490, filed on Jun. 9, 2013, now Pat. No. 9,679,981.

(51) Int. Cl.
| | | |
|---|---|---|
| *H01L 29/778* | (2006.01) | |
| *H01L 29/40* | (2006.01) | |
| *H01L 29/20* | (2006.01) | |

(52) U.S. Cl.
CPC .......... *H01L 29/778* (2013.01); *H01L 29/402* (2013.01); *H01L 29/407* (2013.01); *H01L 29/7787* (2013.01); *H01L 29/2003* (2013.01)

(58) Field of Classification Search
CPC ......... H01L 29/74; H01L 29/78; H01L 29/80; H01L 29/778; H01L 29/812; H01L 29/407; H01L 29/432; H01L 29/66871; H01L 29/7787; H01L 29/402
See application file for complete search history.

(56) References Cited

U.S. PATENT DOCUMENTS

| | | | |
|---|---|---|---|
| 4,290,077 A | 9/1981 | Ronen | 257/409 |
| 4,551,905 A | 11/1985 | Chao et al. | 29/571 |
| 4,946,547 A | 8/1990 | Palmour et al. | |
| 4,947,232 A | 8/1990 | Ashida et al. | |

(Continued)

FOREIGN PATENT DOCUMENTS

| | | |
|---|---|---|
| CN | 1242608 A | 1/2000 |
| CN | 1321340 | 11/2001 |

(Continued)

OTHER PUBLICATIONS

Decision from Taiwanese Patent Appl. No. 095103561 dated Mar. 31, 2014.

(Continued)

*Primary Examiner* — Fazli Erdem
(74) *Attorney, Agent, or Firm* — Koppel, Patrick, Heybl & Philpott

(57) ABSTRACT

A transistor device including a field plate is described. One embodiment of such a device includes a field plate separated from a semiconductor layer by a thin spacer layer. In one embodiment, the thickness of spacer layer separating the field plate from the semiconductor layers is less than the thickness of spacer layer separating the field plate from the gate. In another embodiment, the non-zero distance separating the field plate from the semiconductor layers is about 1500 Å or less. Devices according to the present invention can show capacitances which are less drain bias dependent, resulting in improved linearity.

33 Claims, 7 Drawing Sheets

(56) References Cited

U.S. PATENT DOCUMENTS

| | | | |
|---|---|---|---|
| 5,053,348 A | 10/1991 | Mishra et al. | 438/571 |
| 5,187,552 A | 2/1993 | Hendrickson et al. | |
| 5,192,987 A | 3/1993 | Khan et al. | 257/183.1 |
| 5,196,359 A | 3/1993 | Shih et al. | |
| 5,200,022 A | 4/1993 | Kong et al. | |
| 5,290,393 A | 3/1994 | Nakamura | |
| 5,296,395 A | 3/1994 | Khan et al. | |
| 5,381,031 A | 1/1995 | Shibib | |
| RE34,861 E | 2/1995 | Davis et al. | |
| 5,393,993 A | 2/1995 | Edmond et al. | |
| 5,399,886 A | 3/1995 | Hasegawa | 257/192 |
| 5,470,767 A | 11/1995 | Nakamoto et al. | 438/570 |
| 5,514,992 A | 5/1996 | Tanaka et al. | |
| 5,523,589 A | 6/1996 | Edmond et al. | |
| 5,543,253 A | 8/1996 | Park | 216/12 |
| 5,569,937 A | 10/1996 | Bhatnagar | 257/77 |
| 5,643,811 A | 7/1997 | Hasegawa | 257/E21.407 |
| 5,652,179 A | 7/1997 | Strifler et al. | 438/578 |
| 5,686,738 A | 11/1997 | Moustakas | |
| 5,701,019 A | 12/1997 | Matsumoto et al. | 257/192 |
| 5,710,455 A | 1/1998 | Bhatnagar et al. | 257/472 |
| 5,739,554 A | 4/1998 | Edmond et al. | |
| 5,780,900 A | 7/1998 | Suzuki et al. | 257/335 |
| 5,876,901 A | 3/1999 | Ishimaru | 257/28 |
| 5,929,467 A | 7/1999 | Kawai et al. | 257/192 |
| 5,959,307 A | 9/1999 | Nakamura et al. | 257/14 |
| 6,033,948 A | 3/2000 | Kwon et al. | 438/217 |
| 6,057,564 A | 5/2000 | Rennie | 257/99 |
| 6,100,549 A | 8/2000 | Weitzel et al. | 257/194 |
| 6,100,571 A | 8/2000 | Mizuta et al. | 27/95 |
| 6,127,703 A | 10/2000 | Letavic et al. | 257/347 |
| 6,139,995 A | 10/2000 | Burm | 257/27 |
| 6,140,169 A | 10/2000 | Kawai et al. | 438/197 |
| 6,242,766 B1 | 6/2001 | Tateno | 257/194 |
| 6,294,801 B1 | 9/2001 | Inokuchi | 257/192 |
| 6,307,232 B1 | 10/2001 | Akiyama et al. | |
| 6,316,793 B1 | 11/2001 | Sheppard et al. | |
| 6,346,451 B1 | 2/2002 | Simpson et al. | 21/331 |
| 6,355,951 B1 | 3/2002 | Hattori | 257/280 |
| 6,445,038 B1 | 9/2002 | Tihanyi | |
| 6,468,878 B1 | 10/2002 | Petruzzello et al. | 438/454 |
| 6,475,857 B1 | 11/2002 | Kim | 438/240 |
| 6,483,135 B1 | 11/2002 | Mizuta et al. | |
| 6,495,409 B1 | 12/2002 | Manfra et al. | 438/216 |
| 6,548,333 B2 | 4/2003 | Smith | 257/194 |
| 6,559,513 B1 | 5/2003 | Miller et al. | 257/488 |
| 6,586,781 B2 | 7/2003 | Wu et al. | 257/194 |
| 6,586,813 B2 | 7/2003 | Nagahara | 257/472 |
| 6,620,688 B2 | 9/2003 | Woo et al. | 438/262 |
| 6,621,121 B2 | 9/2003 | Baliga | 257/257 |
| 6,624,488 B1 | 9/2003 | Kim | 29/76 |
| 6,627,473 B1 | 9/2003 | Oikawa et al. | 438/46 |
| 6,674,097 B2 | 1/2004 | Komoto et al. | |
| 6,686,616 B1 | 2/2004 | Allen et al. | 257/280 |
| 6,690,042 B2 | 2/2004 | Khan et al. | 257/192 |
| 6,707,102 B2 | 3/2004 | Morikawa | 257/328 |
| 6,740,535 B2 | 5/2004 | Singh et al. | 438/18 |
| 6,838,325 B2 | 1/2005 | Whelan et al. | 438/172 |
| 6,849,882 B2 | 2/2005 | Chavarkar et al. | |
| 6,891,235 B1 | 5/2005 | Furukawa et al. | 257/408 |
| 6,903,383 B2 | 6/2005 | Yokogawa | 257/192 |
| 6,933,544 B2 | 8/2005 | Saito et al. | 257/194 |
| 6,939,778 B2 | 9/2005 | Harpster et al. | |
| 6,940,090 B2 | 9/2005 | Saito et al. | 257/20 |
| 6,972,440 B2 | 12/2005 | Singh et al. | 257/194 |
| 7,012,286 B2 | 3/2006 | Inai et al. | 257/192 |
| 7,038,252 B2 | 5/2006 | Saito et al. | 257/192 |
| 7,041,541 B2 | 5/2006 | Behammer | 438/182 |
| 7,071,498 B2 | 7/2006 | Johnson | 257/109 |
| 7,075,125 B2 | 7/2006 | Saito et al. | 257/194 |
| 7,126,426 B2 | 10/2006 | Mishra et al. | 330/307 |
| 7,170,111 B2 | 1/2007 | Saxler | |
| 7,229,903 B2* | 6/2007 | Li et al. | 438/571 |
| 7,230,284 B2 | 6/2007 | Parikh et al. | |
| 7,282,423 B2 | 10/2007 | Furukawa et al. | 438/422 |
| 7,416,962 B2 | 8/2008 | Harrison et al. | |
| 7,465,967 B2 | 12/2008 | Smith et al. | 257/194 |
| 7,501,669 B2 | 3/2009 | Parikh et al. | 257/194 |
| 7,501,699 B2 | 3/2009 | Gauche et al. | |
| 7,508,015 B2 | 3/2009 | Saito et al. | 257/192 |
| 7,550,783 B2 | 6/2009 | Wu et al. | 257/194 |
| 7,573,078 B2 | 8/2009 | Wu et al. | |
| 7,679,111 B2* | 3/2010 | Cao et al. | 257/287 |
| 7,800,131 B2* | 9/2010 | Miyamoto et al. | 257/192 |
| 7,812,369 B2 | 10/2010 | Chini et al. | 257/192 |
| 7,863,648 B2 | 1/2011 | Miyamoto et al. | 257/192 |
| 7,964,915 B2* | 6/2011 | Tanaka et al. | 257/341 |
| 8,120,066 B2 | 2/2012 | Lanzieri et al. | 257/194 |
| 8,193,562 B2* | 6/2012 | Suh et al. | 257/194 |
| 8,502,323 B2 | 8/2013 | Chen | 257/392 |
| 8,823,057 B2 | 9/2014 | Sheppard et al. | 257/192 |
| 8,901,604 B2* | 12/2014 | Mishra et al. | 257/170 |
| 2001/0000622 A1 | 5/2001 | Reeh et al. | |
| 2001/0015446 A1 | 8/2001 | Inoue et al. | |
| 2001/0023964 A1 | 9/2001 | Wu et al. | 257/368 |
| 2001/0050371 A1 | 12/2001 | Odaki et al. | |
| 2002/0005528 A1 | 1/2002 | Nagahara | |
| 2002/0017648 A1 | 2/2002 | Kasahara | |
| 2002/0033508 A1 | 3/2002 | Morikawa | 257/368 |
| 2002/0105028 A1 | 8/2002 | Fujihira | 257/339 |
| 2002/0137236 A1 | 9/2002 | Schaff et al. | |
| 2002/0137318 A1 | 9/2002 | Peake et al. | |
| 2002/0139995 A1 | 10/2002 | Inoue et al. | 257/194 |
| 2002/0145172 A1 | 10/2002 | Fujishima et al. | |
| 2002/0155646 A1 | 10/2002 | Petruzzello et al. | |
| 2002/0167023 A1 | 11/2002 | Chavarkar et al. | |
| 2003/0006437 A1 | 1/2003 | Mizuta et al. | |
| 2003/0020069 A1 | 1/2003 | Holmes et al. | |
| 2003/0020092 A1 | 1/2003 | Parikh et al. | |
| 2003/0075719 A1 | 4/2003 | Sriram et al. | |
| 2003/0107081 A1 | 6/2003 | Lee et al. | |
| 2003/0132463 A1 | 7/2003 | Miyoshi | |
| 2003/0141518 A1 | 7/2003 | Yokogawa | 257/194 |
| 2003/0183844 A1 | 10/2003 | Yokoyama et al. | |
| 2003/0183886 A1 | 10/2003 | Inoue et al. | |
| 2003/0222327 A1 | 12/2003 | Yamaguchi et al. | |
| 2004/0021152 A1 | 2/2004 | Nguyen et al. | 257/192 |
| 2004/0029330 A1 | 2/2004 | Hussain et al. | 438/172 |
| 2004/0124435 A1 | 7/2004 | D'Evelyn et al. | 257/103 |
| 2004/0188775 A1 | 9/2004 | Peake et al. | |
| 2004/0201038 A1 | 10/2004 | Kimura et al. | |
| 2004/0227211 A1 | 11/2004 | Saito et al. | |
| 2005/0006209 A1 | 1/2005 | Sorensen | |
| 2005/0051796 A1* | 3/2005 | Parikh | H01L 29/812 257/192 |
| 2005/0051800 A1* | 3/2005 | Mishra et al. | 257/202 |
| 2005/0062069 A1 | 3/2005 | Saito et al. | 257/213 |
| 2005/0082611 A1 | 4/2005 | Peake et al. | |
| 2005/0106408 A1 | 5/2005 | Chen et al. | |
| 2005/0110042 A1 | 5/2005 | Saito et al. | |
| 2005/0124100 A1 | 6/2005 | Robinson | 438/167 |
| 2005/0133818 A1 | 6/2005 | Johnson et al. | 257/192 |
| 2005/0170574 A1 | 8/2005 | Sheppard et al. | |
| 2005/0189559 A1 | 9/2005 | Saito et al. | |
| 2005/0208722 A1 | 9/2005 | Peake et al. | 438/259 |
| 2005/0253167 A1 | 11/2005 | Wu et al. | |
| 2005/0253168 A1* | 11/2005 | Wu | H01L 29/7787 257/192 |
| 2006/0006415 A1* | 1/2006 | Wu | H01L 29/7787 257/194 |
| 2006/0011915 A1 | 1/2006 | Saito et al. | 257/65 |
| 2006/0043416 A1 | 3/2006 | Li et al. | 257/192 |
| 2006/0081877 A1 | 4/2006 | Kohji et al. | 257/194 |
| 2006/0108606 A1 | 5/2006 | Saxler | 257/200 |
| 2006/0118809 A1 | 6/2006 | Parikh et al. | 257/103 |
| 2006/0202272 A1* | 9/2006 | Wu | H01L 29/7787 257/355 |
| 2006/0286732 A1* | 12/2006 | Burke et al. | 438/197 |
| 2007/0025231 A1 | 2/2007 | Ochiai | |
| 2007/0059873 A1* | 3/2007 | Chini et al. | 438/199 |
| 2007/0102727 A1 | 5/2007 | Twynam | 257/194 |
| 2007/0164315 A1 | 7/2007 | Smith | 257/194 |
| 2007/0194354 A1 | 8/2007 | Wu | 257/288 |

(56) References Cited

U.S. PATENT DOCUMENTS

| | | | |
|---|---|---|---|
| 2007/0235775 A1* | 10/2007 | Wu | H01L 29/404 257/288 |
| 2007/0241368 A1 | 10/2007 | Mil'shtein | 257/192 |
| 2007/0249119 A1* | 10/2007 | Saito | 438/253 |
| 2007/0290762 A1 | 12/2007 | Lin et al. | |
| 2008/0006898 A1 | 1/2008 | Yafune et al. | 257/471 |
| 2008/0067558 A1* | 3/2008 | Kawasaki | 257/263 |
| 2008/0116492 A1* | 5/2008 | Wu | H01L 29/2003 257/213 |
| 2008/0128752 A1* | 6/2008 | Wu | H01L 29/402 257/194 |
| 2008/0230786 A1* | 9/2008 | Heikman | H01L 29/402 257/76 |
| 2009/0032820 A1 | 2/2009 | Chen | 257/76 |
| 2009/0230429 A1* | 9/2009 | Miyamoto et al. | 257/192 |
| 2009/0230430 A1* | 9/2009 | Miyamoto et al. | 257/192 |
| 2009/0236635 A1* | 9/2009 | Wu et al. | 257/194 |
| 2010/0025730 A1* | 2/2010 | Heikman | H01L 29/7787 257/194 |
| 2010/0155780 A1 | 6/2010 | Machida | |
| 2010/0201439 A1* | 8/2010 | Wu et al. | 327/581 |
| 2010/0276698 A1 | 11/2010 | Moore et al. | |
| 2011/0241020 A1 | 10/2011 | Saunier | 257/77 |
| 2011/0260217 A1 | 10/2011 | Okamoto | |
| 2012/0049973 A1 | 3/2012 | Smit et al. | |
| 2012/0068722 A1 | 3/2012 | Khandelwal | |
| 2012/0068772 A1* | 3/2012 | Murad | H01L 29/402 330/296 |
| 2012/0104408 A1 | 5/2012 | Imada | 257/76 |
| 2012/0132959 A1 | 5/2012 | Parikh et al. | 257/194 |
| 2012/0175679 A1 | 7/2012 | Marino et al. | 257/194 |
| 2012/0194276 A1 | 8/2012 | Fisher | |
| 2012/0218783 A1* | 8/2012 | Imada | 363/17 |
| 2012/0235156 A1 | 9/2012 | Kuraguchi | 257/76 |
| 2012/0261720 A1* | 10/2012 | Puglisi et al. | 257/194 |
| 2013/0062667 A1* | 3/2013 | Chini et al. | 257/195 |
| 2013/0069115 A1* | 3/2013 | Nakazawa | H01L 29/402 257/192 |
| 2013/0069117 A1 | 3/2013 | Yoshioka | |
| 2013/0083567 A1* | 4/2013 | Imada | 363/37 |
| 2013/0175544 A1 | 7/2013 | Oishi | |
| 2013/0193485 A1* | 8/2013 | Akiyama et al. | 257/194 |
| 2013/0292699 A1 | 11/2013 | Ueno | 257/76 |
| 2014/0001478 A1* | 1/2014 | Saunier et al. | 257/76 |
| 2014/0061659 A1* | 3/2014 | Teplik et al. | 257/76 |
| 2014/0175453 A1 | 6/2014 | Yamada | 257/76 |
| 2014/0239346 A1* | 8/2014 | Green et al. | 257/192 |
| 2014/0264360 A1* | 9/2014 | Huang et al. | 257/76 |
| 2014/0353720 A1* | 12/2014 | Inoue | H01L 29/7827 257/192 |
| 2014/0361341 A1* | 12/2014 | Sriram et al. | 257/194 |
| 2014/0361343 A1* | 12/2014 | Sriram | 257/194 |

FOREIGN PATENT DOCUMENTS

| | | |
|---|---|---|
| CN | 1321340 A | 11/2001 |
| CN | 1242608 | 1/2003 |
| CN | 1428870 A | 7/2003 |
| CN | 1639875 A | 7/2005 |
| EP | 0069429 | 1/1983 |
| EP | 0792028 | 8/1997 |
| EP | 1336989 | 8/2003 |
| EP | 1336989 A2 | 8/2003 |
| JP | 305536 A | 2/1991 |
| JP | 03035536 | 2/1991 |
| JP | 05021793 A | 1/1993 |
| JP | 06349859 | 12/1994 |
| JP | 6349859 | 12/1994 |
| JP | 6349859 A | 12/1994 |
| JP | 07038108 | 2/1995 |
| JP | 07050413 | 2/1995 |
| JP | 07176544 | 7/1995 |
| JP | 09232827 | 9/1997 |
| JP | H09232827 | 9/1997 |
| JP | 11008256 | 1/1999 |
| JP | H118256 | 1/1999 |
| JP | 1197455 | 4/1999 |
| JP | 11233525 | 8/1999 |
| JP | 11274174 | 10/1999 |
| JP | 2000003919 | 1/2000 |
| JP | 2000082671 | 3/2000 |
| JP | 2000100831 A | 4/2000 |
| JP | 2000174260 | 6/2000 |
| JP | 2000003919 A | 7/2000 |
| JP | 2001094091 | 4/2001 |
| JP | 2001160656 | 6/2001 |
| JP | 2001189324 | 7/2001 |
| JP | 2002016245 | 1/2002 |
| JP | 2006450212 | 1/2002 |
| JP | 2002094054 | 3/2002 |
| JP | 2002100642 | 4/2002 |
| JP | 2002118122 | 4/2002 |
| JP | 2000270620 | 9/2002 |
| JP | 2002270830 A | 9/2002 |
| JP | 2002343814 | 11/2002 |
| JP | 2002094054 A | 3/2003 |
| JP | 2003100775 | 4/2003 |
| JP | 2003188189 | 7/2003 |
| JP | 2003203923 | 7/2003 |
| JP | 2003203923 A | 7/2003 |
| JP | 297854 | 10/2003 |
| JP | 2003297854 | 10/2003 |
| JP | 2003297854 A | 10/2003 |
| JP | 2005507174 | 3/2005 |
| JP | 2005093864 | 4/2005 |
| JP | 2005527102 A | 9/2005 |
| JP | 2005340417 | 12/2005 |
| JP | 2007019560 | 1/2007 |
| JP | 2010278333 | 12/2010 |
| KR | 20000006218 | 1/2003 |
| TW | 334632 B | 6/1998 |
| TW | 552712 B | 9/2003 |
| TW | 579600 B | 3/2004 |
| TW | I2230978 B | 4/2005 |
| WO | WO 9908323 | 2/1999 |
| WO | WO 02093650 | 11/2002 |
| WO | WO 03/038905 A | 5/2003 |
| WO | WO 03036729 | 5/2003 |
| WO | WO 03036729 A1 | 5/2003 |
| WO | WO 03038905 A2 | 5/2003 |
| WO | WO 2004068590 | 8/2004 |
| WO | WO 2004068590 A1 | 8/2004 |
| WO | WO 2006025971 | 7/2005 |
| WO | WO 2005114743 | 12/2005 |
| WO | WO 2006025971 | 3/2006 |

OTHER PUBLICATIONS

First Office Action from Chinese Patent Appl. No. 2011102654868, dated Jun. 19, 2013.

Notice of Reasons for Rejection from Japanese Patent Appl. No. 2007-513132, dated Jun. 25, 2013.

Office Action from Japanese Patent Appl, No. 2008-500703, dated Jun. 25, 2013.

A.J. Bergsma, "A Comprehensive Design Method for Dual Gate MOSFET Mixers", Ottawa Carleton Institute for Electrical Engineering, Dept. of Electronics. Carleton University. Ottawa. Canada. May 1995, © 1998 AJ Bergsma.

Vetury, et al., "Performance and RF Reliability of GaN—ON—SiC HEMTs Using Dual-Gate Architectures", Air Force Research Laboratory. Jul. 2006, Air Force Contract No. FA8650-05-C-5411, Wright-Patterson Air Force Base, OH 45433-7750.

Office Action from Taiwanese Patent Appl. No. 101131917, dated Jul. 26, 2013.

Examination Report from European Patent Appl. No. 06 718 166.5, dated Aug. 13, 2013.

Office Action from U.S. Appl. No. 10/958,945, dated Aug. 16, 2013.

Office Action from U.S. Appl. No. 11/078,265, dated Aug. 15, 2013.

Office Action from U.S. Appl. No. 13/355,766, dated Aug. 9, 2013.

Office Action from U.S. Appl. No. 13/245,579, dated Oct. 25, 2013.

(56) References Cited

OTHER PUBLICATIONS

Examination Report from Canadian Patent Appl. No. 2,566,756, dated Nov. 7, 2013.
European Search Report from European Patent Appl. No. 12180744.0-1552, dated Dec. 12, 2013.
Examination Report from Canadian Patent Appl. No. 2,564,955, dated Dec. 6, 2012.
Notice of Reasons for Rejection from Japanese Patent Appl. No. 2008-500703, dated Nov. 12, 2013.
Office Action from U.S. Appl. No. 10/958,945, dated Nov. 14, 2013.
Response to OA from U.S. Appl. No. 10/958,945, filed Jan. 10, 2014.
Second Office Action from Chinese Patent Appl. No. 201110265486.8, dated Mar. 13, 2014.
Notice of Reasons for Rejection from Japanese Patent Appl. No. 2007-513167, dated Feb. 4, 2014.
Office Action from U.S. Appl. No. 11/078,265, dated Apr. 28, 2014.
Summary of Decision of Rejection for Japanese Application No. 2007-513132, dated Mar. 13, 2012.
Decision of Rejection from Taiwanese Application No. 094111532, dated Apr. 11, 2012.
Office Action from U.S. Appl. No. 10/786,755, dated Jun. 22, 2011.
Office Action from U.S. Appl. No. 11/807,701, dated May 18, 2010.
Office Action from U.S. Appl. No. 11/807,701, dated Jan. 26, 2010.
Office Action from U.S. Appl. No. 12/321,493, dated Aug. 18, 2010.
Office Action from U.S. Appl. No. 12/321,493, dated Jun. 23, 2011.
Office Action from U.S. Appl. No. 12/321,493, dated Jan. 26, 2011.
Office Action from U.S. Appl. No. 12/437,505, dated Jul. 21, 2010.
Office Action from U.S. Appl. No. 12/497,468, dated Aug. 18, 2011.
Office Action from U.S. Appl. No. 12/497,468, dated Mar. 7, 2011.
Office Action from U.S. Appl. No. 10/958,945, dated Sep. 23, 2011.
Office Action from U.S. Appl. No. 10/958,945, dated Apr. 1, 2011.
Office Action from U.S. Appl. No. 10/958,945, dated Sep. 1, 2010.
Office Action from U.S. Appl. No. 10/958,945, dated Jan. 28, 2010.
Office Action from U.S. Appl. No. 11/078,265, dated Jun. 15, 2011.
Office Action from U.S. Appl. No. 11/078,265, dated Jan. 20, 2010.
Office Action from U.S. Appl. No. 11/600,617, dated Dec. 22, 2009.
Office Action from U.S. Appl. No. 11/584,135, dated Jun. 15, 2011.
Office Action from U.S. Appl. No. 11/901,103, dated Feb. 11, 2011.
Office Action from U.S. Appl. No. 11/901,103, dated Jun. 8, 2010.
Examiner's Report for Canadian Patent Application No. 2,566,756, dated Feb. 16, 2012.
Examiner's Report for Canadian Patent Application No. 2,564,955, dated Feb. 24, 2012.
Summary of "Notice of Reasons for Rejection", Japanese Patent Application No. 2008-500703, dated Jan. 10, 2012.
Summary of "Notice of Reasons for Rejection", Japanese Patent Application No. 2007-238147, dated Jan. 24, 2012.
Notice of Reasons for Rejection for Japanese Patent Appl. No. 2007-513167, dated Jan. 9, 2013.
European Search Report from European Patent Application No. 12171403.4-2203/2515339, dated Nov. 12, 2012.
European Search Report from European Patent Application No. 12171401.8-2203/2515338, dated Nov. 13, 2012.
Decision of Rejection from Japanese Patent Application No. 2008-500703, dated Nov. 20, 2012.
Decision of Rejection from Japanese Patent Application No. 2007-513155, dated Nov. 13, 2012.
Examination Report for European Patent Application No. 05756258.9 dated Dec. 11, 2012.
Office Action from Taiwanese Patent Application No. 094111532, dated Nov. 23, 2012.
Interrogation from Japanese Patent Application No. 2007-513132, dated Sep. 25, 2012.
Office Action and Search Report from Taiwanese Patent Application No. 093127333, dated Jul. 5, 2012.
Office Action and Search Report from Taiwanese Patent Application No. 095103561, dated Jul. 24, 2012.
Office Action from Taiwanese Patent Application No. 094114829, dated May 29, 2012.
Japanese Patent Application Laid-open No. 2001230407 Patent Abstracts of Japan.
Japanese Patent Application Laid-open No. 2002-343814 Patent Abstracts of Japan.
Japanese Patent Application Laid-open No. 63-087773 Patent Abstracts of Japan.
Japanese Patent Application Laid-open No. 2001-230263 Patent Abstracts of Japan.
Japanese Patent Application No. 2003-307916 (Laid-open No. 2005-079346) Patent Abstracts of Japan.
European Examination Report Application No. 05731252.2-2203 dated Jul. 30, 2008.
First Office Action from China, Application No. 200480032782.1, dated Jul. 18, 2008.
Saito, et al., "Theoretical limit estimation of lateral wide band-gap semiconductor power-switching device", Solid-State Electronics 48 (2004), pp. 1555-1562.
International Search Report, PCT/JP03/00843, dated Mar. 28, 2003.
Second Office Action from related China Application No. 200580015278.5, dated Dec. 19, 2008.
Communication Pursuant to Article 94(3) EPC re: related European Application No. 07018026.0.
Patent Abstracts of Japan, Pub. No. 07176544, Pub. Date: Jul. 14, 1995.
Official Notice of Final Decision of Rejection re Japan Patent App. No. 2006-526270, dated Jan. 23, 2009.
First Examination Report from related European Appl. No. 04 788 642.9-2203.
Second Office Action from related Chinese Appl. No. 200480032782.1, dated Dec. 28, 2009.
Office Action from related U.S. Appl. No. 11/078,265, dated Jan. 20, 2010.
Office Action from related U.S. Appl. No. 11/807,701, dated Jan. 26, 2010.
Notification of Rejection/Objection for Chinese Patent Appl. No. 200580014868.6, dated Aug. 11, 2010.
Office Action for European Patent Appl. No. 05735109.0 dated Aug. 27, 2010.
Extended Search Report for European Patent Appl. No. 10183441.4 dated Nov. 24, 2010.
Extended Search Report for European Patent Appl. No. 10183607.0 dated Nov. 29, 2010.
Notice Requesting Submission of Opinion in counterpart Korean Patent Appl. No. 10-2006-7004682, dated Feb. 17, 2011.
PCT International Preliminary Report for Group related Applications, Appl. No. PCT/US05/09984, dated Aug. 25, 2008.
Office Action from European Patent Appl. No. 05756258.9, dated Jun. 10, 2010.
Wu et al. "High Al Content AlGaN/GaN HEMTS With Very High Performance", IEDM 1999 Digest pp. 925-927, Washington. D.C. Dec. 1999.
IEEE Transactions on Electron Devices, vol. 48, No. 3 Mar. 2001, p. 581-585.
Kahn et al., "AlGaN/GaN Metal-Oxide-Semiconductor Heterostructure Field-Effect Transistors on SiC Substrates", Applied Physics Letters, American Institute of Physics, New York, US, vol. 77, No. 9, Aug. 2000, p. 1339-1341, XP000951319 ISSN: 0003-6951.
Lu et al. "P-Type SiGe Transistors With Low Gate Leakage Using SiN Gate Dielectric", IEEE Electron Device Letters, IEEE, Inc., New York, US, vol. 20, No. 10, Oct. 1999 (Oct. 1999), p. 514-516, XP000890470, ISSN: 0741-3106.
Zhang N-Q et al., "High Breakdown GaN HEMT With Overlapping Gate Structure", IEEE Electron Device Letters, IEEE, Inc, New York, US, vol. 9, Sep. 2000 (Sep. 2000), p. 373-375, XP000954354, ISSN: 0741-3106.
Second Office Action from related Chinese Application No. 200580014866.7, dated Oct. 30, 2009.
Chinese Patent Appl. No. 200580014868.6, second Office Action dated Feb. 24, 2010.
Examiner's First Report on Patent Appl. Re related Australian Appl. No. 2005246697, dated Mar. 19, 2010.
International Search Report, PCT/US05/26064, dated Jan. 6, 2006.

(56) References Cited

OTHER PUBLICATIONS

International Search Report, PCT/US98/16295, dated Dec. 15, 1998.
International Search Report, PCT/US2005/012821, dated Mar. 29, 2006.
First Office Action re related Chinese Application No. 200580015278.5, dated May 9, 2008.
Office Action for Korean Patent Appl. No. 10-2006-7026207, dated Jul. 26, 2011.
Office Action for Taiwan Patent Appl. No. 094111532, dated Jul. 4, 2011.
Extended Examination Report for European patent Appl. No. EP05731252.2, dated May 11, 2011.
Office Action for Taiwan Patent Appl. No. TW09312733, dated Apr. 29, 2011.
Office Action for Korean Patent Appl. No. KR 10-2006-7026090, dated May 17, 2011.
Japanese Patent Application No. 2003-081849 (Laid-open No. 2004-289038) Patent Abstracts of Japan.
Official Notice of Rejection dated Jun. 24, 2008, Japanese Patent Application No. 2006-526270 and comments.
CRC Press, *The Electrical Engineering Handbook*, Second Edition, Dorf, (1997) p. 994.
B. Belmont, K. Kim, and M. Shur, "Monte Carlo Simulation of Electron Transport in Gallium Nitrate," *Journal of Applied Physics*, vol. 74, Issue 3, (Aug. 1, 1993) p. 1818.
R. Gaska, J.W. Yang, A. Osinsky, Q. Chen, M.A. Khan, A.O. Orlov, G.L. Snider, M.S. Shur, "Electron Transport in ALGaN Heterostructures Grown on 6H-SiC Substrates," *Applied Physics Letters*, vol. 72, No. 6 (Feb. 9, 1998) p. 707.
Y. F. Wu et. al. "GaN-Based FETs for Microwave Power Amplification," *IEICE Transactions on Electronics*, E-82-C, (1999), p. 1895.
Y.F. Wu, D. Kapolnek, J.P. Ibettson, P. Parikh, B.P. Keller, and U.K. Mishra, "Very-High Power Density AlGaN/GaN HEMTS," *IEEE Transactions on Electronic Devices*, vol. 48, Issue 3 (Mar. 2001) p. 586.
M. Micovic, A. Kurdoghlian, P. Janke, P. Hashimoto, D.W.S. Wong, J. S. Moon, L. Moray, and C. Nguyen, "ALGaN/GaN Heterojunction Field Effect Transistors Grown by Nitrogen Plasma Assisted Molecular Beam Epitaxy," *IEEE Transactions on Electronic Devices*, vol. 48, Issue 3, (Mar. 2001) p. 591.
Gaska et al., "High Temperature Performance of AlGaN/GaN HFET's on SiC Substrates," *IEEE Electron Device Letters* vol. 18, No. 10, (Oct. 1997) p. 492.
Ping et al., "DC and Microwave Performance of High Current AlGaN Heterostructure Field Effect Transistors Grown on P-Type SiC Substrates," *IEEE Electron Device Letters* vol. 19, No. 2, (Feb. 1998) p. 54
L. Eastman, K. Chu, J. Smart, J. R. Shealy, "GaN Materials for High Power Microwave Amplifiers," *Materials Research Society* vol. 512 Wocsemmad, Monterey, CA (Feb. 1998) p. 3-7.
G. Sullivan et al., "High Power 10-GHz Operation of AlGaN HFET's in Insulating SiC." *IEEE Electron Device Letters* vol. 19, No. 6, (Jun. 1998) p. 198.
Wu et al., "High AL-Content AlGaN/GaN MODFETs for Ultrhigh Performance," *IEEE Electron Device Letters* vol. 19, No. 2, (Feb. 1998) p. 50.
Y. Ando, et al., "10-W/mm AlGaN—GaN HFET With a Field Modulating Plate," *IEEE Electron Device Letters* vol. 24, No. 5, (May 2003) p. 289-292.
S. Karmalkar, U.K. Mishra, "Very High Voltage AlGaN/GaN High Electron Mobility Transistors Using a Field Plate Deposited on a Stepped Insulator," *Solid-State Electronics* vol. 45, (2001) pp. 1645-1652.
W. Saito et al., "600V AlGaN/GaN Power-HEMT: Design, Fabrication and Demonstration on High Voltage DC-DC Converter," *IEEE IEDM* vol. 23, No. 7, (2003) pp. 587-590.
Wu et al., "High-Gain Microwave GaN HEMTS With Source-Terminated Field-Plates", Cree Santa Barbara Technology Center.
Wu et al., "30-W/MM GaN HEMTS by Field Plate Optimization", IEEE, vol. 25, No. 3, Mar. 2004, p. 117-119.
Saito et al. Solid State Electronics, Theoretical Limit Estimation of Lateral Wide Bandgap Semiconductor Power-Switching Device Apr. 1, 2003, p. 1555-1562.
Office Action from related family, U.S. Appl. No. 11/807,701, dated Aug. 22, 2008.
Office Action from related family, U.S. Appl. No. 10/958,970, dated Sep. 10, 2008.
Saito et al. "High Breakdown Voltage AlGaN—GaN Power HEMT Design and High Current Density Switching Behavior", IEEE Transactions on Electron Devices, vol. 50, No. 12, Dec. 2003, pp. 2528-2531.
Heikman et al. "Growth of Fe Doped Semi-Insulating GaN by Metalorganic Chemical Vapor Deposition" Applied Physics Letters, vol. 81, No. 3, Jul. 2002, pp. 439-441.
Heikman, Growth and Characteristics of Fe-Doped GaN, Journal of Crystal Growth 248 (2003), 513-517.
Asano K et al: "Novel High Power AlGaAs/GaAs HFET With a Field-Modulating Plate Operated at 35 V Drain Voltage", Electron Devices Meeting, 1998, IDM '98 Technical Digest, International San Francisco, CA USA Dec. 6-9, 1998, Piscataway, NJ, USA IEEE US, Dec. 6, 1998, pp. 59-62 XP010321500.
Wakejima A et al. "High Power Density and Low Distortion Ingap Channel FETS With Field-Modulating Plate", IEICE Transactions on Electronics, Institute of Electronics Information and Comm. Eng. Tokyo, JP, vol. E85-C, No. 12, Dec. 2002, pp. 2041-2045, XP001161324.
Mok P K T et al, "A Novel High-Voltage High-Speed MESFET Using a Standard GaAs Digital IC Process" IEEE Transactions on Electron Devices, IEEE Inc. New York, US, vol. 41, No. 2, Feb. 1, 1994, pp. 246-250, XP000478051.
Li J, et al "High Breakdown Voltage GaN HFET With Field Palte" Electronics Letters, IEE Stevenage, GB vol. 37, No. 3, Feb. 1, 2001, pp. 196-197, XP006016221.
Xing H. et al. "High Breakdown Voltage AlGaN—GaN HEMTS Achieved by Multiple Field Plates" IEEE Electron Device Letters, IEEE Inc. New York, US, vol. 25, No. 4, Apr. 2004, pp. 161-163, XP001190361.
Saito et al. "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP vol. 43, No. 4B, Apr. 2004 pp. 2239-2242, XP001227744, ISSN: 0021-4922.
Tilak, et al., "Effect of Passivation on AlGaN/GaN HEMT Device Performance" 2000 IEEE International Symposium on Compound Semiconductors. Proceedings of the IEEE $27^{th}$ International Symposium on Compound Semiconductors (Cat. No. $00^{th}8498$), 2000 IEEE International Symposium on Compound Semiconductors Proceedings of the, p. 357-363, XP002239700, 2000 Piscataway, NJ, USA, IEEE, US ISBN: 0-7803-6258-6.
Xing, et al., "High Breakdown Voltage AlGaN—GaN HEMTs Achieved by Multiple Field Plates", XP-001190361, IEEE Electron Device Letters., vol. 25, No. 4, Apr. 2004.
Pretrial Examination Communication from Examiner from Japanese Patent Appl. No. 2008-500703, Appeal No. 2013-05298, dated Jun. 3, 2013.
Office Action from U.S. Appl. No. 10/958,945, dated May 15, 2013.
Response to Office Action U.S. Appl. No. 10/958,945, dated Mar. 14, 2013.
Office Action from U.S. Appl. No. 10/958,945, dated Mar. 14, 2013.
Office Action from U.S. Appl. No. 12/497,468, dated Mar. 12, 2013.
Response to Office Action U.S. Appl. No. 12/497,468, dated Nov. 20, 2012.
Office Action from U.S. Appl. No. 12/497,468, dated Nov. 20, 2012.
Office Action from U.S. Appl. No. 13/245,579, dated Jan. 31, 2013.
Office Action from U.S. Appl. No. 13/072,449, dated Dec. 13, 2012.
Response to Office Action U.S. Appl. No. 13/072,449, filed Feb. 13, 2013.
International Search Report and Written Opinion from Appl. No. PCT/US2014/041171, dated Sep. 22, 2014.

(56) References Cited

OTHER PUBLICATIONS

R. Vetury, et al., "Performance and RF Reliability of GaN-on-SiC HEMT's using Dual-Gate Architectures", RF Micro Devices, Charlotte, NC, 28269, p. 714.
Office Action from U.S. Appl. No. 13/355,766, dated Jul. 30, 2014.
Appeal Decision from Japanese Patent Appl. No. 2007-513155, dated Mar. 11, 2014.
Office Action from U.S. Appl. No. 13/355,766, dated Mar. 5, 2014.
Office Action from U.S. Appl. No. 13/245,579, dated Mar. 13, 2014.
Office Action from U.S. Appl. No. 10/958,945, dated Mar. 31, 2014.
Interrogation from Japanese Patent Application No. 2007-513155, dated Jun. 25, 2013.
Decision of Rejection from Japanese Patent appl. No. 2007-513167, dated Jul. 4, 2013.
Office Action from Taiwanese Patent Appl. No. 095103561, dated Jun. 27, 2013.
Office Action from Japanese Patent Appl. No. 2013-050780, dated Jul. 1, 2014.
Third Office Action from Chinese Patent Appl. No. 200580014868.6, dated Jul. 2, 2014.
Third Office Action from Chinese Appl. No. 201110265486.8, dated Sep. 17, 2014.
Communication from European Appl. No. 07 018 026.0-1552, dated Oct. 14, 2014.
Reason for Rejection from Japanese Patent Appl. No. 2012-157890, dated Dec. 24, 2013.
European Search Report from European Patent Appl. No. EP 2 538 446 A3, dated Jan. 15, 2014.
Reasons for Rejection from Japanese Patent Appl. No. 2012-107672, dated Dec. 24, 2013.
Reasons for Rejection from Japanese Patent Appl. No. 2012-117726, dated Dec. 24, 2013.
Decision of Rejection from Japanese Appl. No. 2012-157890, dated Oct. 21, 2014.
Office Action from Taiwanese Patent Appl. No. 101124701, dated Oct. 14, 2014.
Office Action from Japanese Patent Appl, No. 2012-107672, dated Nov. 11, 2014.
Office Action from Japanese Patent Appl. No. 2013-050780, dated Dec. 9, 2014.
Office Action and Search Report from Taiwanese Appl. No. 102102725, dated Dec. 8, 2014.
J. Li, et al., "High Breakdown Voltage GaN HFET with Field Plate", Electronic Letters. Feb. 1, 2001; vol. 37, No. 3.
Office Action from Taiwanese Patent Appl. No. 101137523, dated Dec. 31, 2014.
Examiner Report from Canadian Patent Appl. No. 2,566,361, dated Feb. 4, 2015.
Decision of Rejection from Japanese Patent Application No. 2012-117726, dated Jan. 27, 2015.
Zhang, et al., "High Breakdown GaN HEMT with Overlapping Gate Structure", IEEE Electron Device Letters, vol. 21, No. 9, Sep. 2000.
Office Action from U.S. Appl. No. 13/913,490, dated Dec. 16, 2014.
Office Action from U.S. Appl. No. 11/078,265, dated Dec. 29, 2014.
Office Action from U.S. Appl. No. 10/958,945, dated Dec. 31, 2014.
Office Action from U.S. Appl. No. 14/025,478, dated Jan. 21, 2015.
Office Action from U.S. Appl. No. 13/355,766, dated Feb. 13, 2015.
Notice of Allowance from Taiwanese Patent Appl. No. 101124701, dated Mar. 2, 2015.
Fourth Office Action from Chinese Patent Appl. No. 200580014868.6 dated Feb. 15, 2015.
Notice of Allowance from Taiwanese Patent Appl. No. 095103561, dated Feb. 17, 2015.
Intention to Grant from European Patent Appl. No. 07018026.0-1552, dated Mar. 25, 2015.
Fourth Office Action from Chinese Patent Appl. No. 201110265486.8, dated Apr. 15, 2015.
Examination from Canadian Patent Appl. No. 2,564,955, dated Apr. 7, 2015.
Saito, et al, "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP, vol. 43, No. 4B, Apr. 2004, pp. 2239-2242, XP001227744, ISSN: 0021-4922.
Saito, et al, "Theoretical Limit Estimation of Lateral Wide Bandgap Semiconductor Power-switching Device", Solid State Electronics, Elsevier Science Publishers, Barking, GP, vol. 48, No. 9, Apr. 23, 2004, pp. 1555-1562, XP004518805, ISSN: 0038-1101.
Notice of Allowance from Taiwanese Patent Appl. No. 101137523, dated Sep. 25, 2015.
Examination Report from European Patent Appl. No. 10 183 441.4, dated Jul. 29, 2015.
Decision of Patent Grant from Japanese Patent Appl. No. 2012-157890, dated Aug. 18, 2015.
Fifth Office Action from Chinese Patent Appl. No. 200580014868.6, dated Aug. 27, 2015.
Office Action from Taiwanese Patent Appl. No. 103120237, dated Sep. 15, 2015.
Office Action from U.S. Appl. No. 14/025,478, dated Aug. 4, 2015.
Response to OA from U.S. Appl. No. 14/025,478, filed Sep. 22, 2015.
Office Action from Patent Application No. 11/078, dated Sep. 18, 2015.
Office Action from U.S. Appl. No. 10/956,945, dated Oct. 1, 2015.
Examination Report from Taiwanese Patent Appl. No. 103119694, dated Oct. 19, 2015.
Fifth Office Action and Search Report from Chinese Patent Appl. No. 201110265486.8, dated Dec. 3, 2015.
K. Asano, et al., "Novel High Power AlGaAs/GaAs HFET with a Field-Modulating Plate Operated at 35V Drain Voltage", ULSI Device Development Laboratories, NEC Corporation 9-1, Seiran 2-Chome, Otsu, Shiga 520-0833, Japan, 62-IEDM 98, pub. Date: Dec. 6, 1998.
Examination Report from European Patent Appl. No. 12 171 401.8, dated Nov. 5, 2015.
Office Action from Taiwanese Patent Appl. No. 102102725, dated May 18, 2015.
Decision to Grant from European Patent Appl. No. 07018026.0, dated Aug. 6, 2015.
Office Action from U.S. Appl. No. 13/355,766, dated Jun. 22, 2015.
Office Action from Japanese Patent Appl. No. 2012-157890, dated Apr. 22, 2015.
Notice of Allowance from Japanese Patent Appl. No. 2013-050780, dated Apr. 28, 2015.
Reasons for Rejection from Japanese Patent Appl. No. 2014-126655, dated May 26, 2015.
Office Action from Japanese Patent Appl. No. 2012-107672, dated Jun. 9, 2015.
Office Action from U.S. Appl. No. 11/078,265, dated Apr. 1, 2015.
Office Action from U.S. Appl. No. 10/958,945, dated May 1, 2015.
Office Action from Japanese Patent Appl. No. 2014-126655, dated Jan. 26, 2016.
Correction of deficiencies from European Patent Appl. No. 14734340.4, dated Jan. 27, 2016.
Correction of deficiencies from European Patent Appl. No. 14727697.6, dated Jan. 20, 2616.
Examination from European Patent appl. No. 12 171 403.4-1552, dated Jan. 21, 2016.
Office Action from U.S. Appl. No. 13/913,490; dated Nov. 25, 2015.
Office Action from U.S. Appl. No. 14/025,478; dated Dec. 4, 2015.
Office Action from U.S. Appl. No. 11/078,265; dated Dec. 9, 2015.
Office Action from U.S. Appl. No. 10/958,945; dated Jan. 6, 2016.
Office Action from U.S. Appl. No. 13/929,487; dated Feb. 5, 2016.
Office Action from U.S. Appl. No. 13/813,490; dated May 26, 2016.
Foreign Office Action for Application No. 103120237; dated Jun. 8, 2016.
Office Action from U.S. Appl. No. 11/078,265; dated Jun. 23, 2016.
Office Action from U.S. Appl. No. 14/025,478; dated Jul. 5, 2016.
Notice of Allowance for Japanese Application No. 2014-126655; dated Jul. 5, 2016.

(56) References Cited

OTHER PUBLICATIONS

Notice of Allowance for Indian Application No. 6483/DELNP/2006; dated Aug. 4, 2016.
Office Action from U.S. Appl. No. 10/956,943; dated Apr. 13, 2016.
Notice of Allowance for Application No. 2,564,955; dated Feb. 29, 2016.
Notice of Allowance for Application No. 2,566,361; dated Mar. 15, 2016.
Notice of Reasons for Rejection for Application No. 2015-145765; dated Apr. 26, 2016.
Foreign Office Action for Taiwan Application No. 103120237: dated Oct. 20, 2016.
Foreign Office Action for Japanese Application No. 2015-145765; dated Nov. 18, 2016.
Office Action for U.S. Appl. No. 14/025,478; dated Dec. 1, 2016.
Foreign Office Action for European Appl. No. 14734340.4; dated Jan. 5, 2017.
Foreign Office Action for European Appl. No. 14733486.6; dated Jan. 5, 2017.
Office Action for U.S. Appl. No. 10/958,945; dated Jan. 10, 2017.
Japanese Office Action for Application No. 2015-145765; dated Apr. 18, 2017.
Japanese Petition Decision Application No. 2015-018473; dated Mar. 14, 2017.
Saito Wet Al: "Design and Demonstration of High Breakdown Voltage GAN High Electron Mobility Transistor (HEMT) Using Field Plate Structure for Power Electronics Applications", Japanese Journal of Applied Physics, Japan Society of Applied Physics, Tokyo, JP, vol. 43, No. 4B, Apr. 2004 (Apr. 2004), pp. 2239-2242, XP001227744, ISSN: 0021-4922.
Foreign Office Action for European Application No. 5735109.0; dated Aug. 2, 2017.
Office Action for U.S. Appl. No. 11/078,265; dated Sep. 11, 2017.

\* cited by examiner

RECESSED FIELD PLATE TRANSISTOR STRUCTURES

This application is a continuation-in-part of and claims the benefit of U.S. patent application Ser. No. 13/913,490, filed on Jun. 9, 2013 and entitled "Cascode Structures for GaN HEMTs," which is fully incorporated by reference herein in its entirety.

BACKGROUND OF THE INVENTION

Field of the Invention

The present invention relates to cascode structures and particularly to dual-gate transistors having an insulating layer below one gate. The present invention also relates to transistors including a field plate and particularly to transistors having a field plate relatively near the semiconductor layers.

Description of the Related Art

Materials such as silicon (Si) and gallium arsenide (GaAs) have found wide application in semiconductor devices for low power and, in the case of Si, low frequency applications. However, these more familiar semiconductor materials may not be well-suited for high power and/or high frequency applications, for example, due to their relatively small bandgaps (1.12 eV for Si and 1.42 for GaAs at room temperature) and relatively small breakdown voltages.

In light of the difficulties presented by Si and GaAs, interest in high power, high temperature and/or high frequency applications and devices has focused on wide bandgap semiconductor materials such as silicon carbide (2.996 eV for alpha SiC at room temperature) and the Group III nitrides (e.g., 3.36 eV for GaN at room temperature). These materials, typically, may have higher electric field breakdown strengths and higher electron saturation velocities as compared to GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies. The smaller bandgap material may have a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

Different types of HEMTs in the GaN/AlGaN system have been demonstrated. For example, U.S. Pat. Nos. 5,192, 987 and 5,296,395 describe AlGaN/GaN HEMT structures and methods of manufacture. In addition, U.S. Pat. No. 6,316,793, to Sheppard et al., which is commonly assigned with the present application, describes a HEMT device having a semi-insulating silicon carbide substrate, an AlN buffer layer on the substrate, an insulating GaN layer on the buffer layer, an AlGaN barrier layer on the GaN layer, and a passivation layer on the AlGaN active structure. Moreover, U.S. Patent Application Publication No. U.S. 2005/0170574 to Sheppard et al., which is also commonly assigned, describes a HEMT device including a protective layer and/or a low damage recess fabrication technique which may reduce damage to the semiconductor in the gate region of the transistor that can occur during an anneal of the ohmic contacts of the device.

Electron trapping and the resulting difference between DC and RF characteristics can be a limiting factor in the performance of these devices. Silicon nitride (SiN) passivation has been employed to alleviate this trapping problem resulting in high performance devices with power densities over 10 W/mm at 10 Ghz. For example, commonly assigned U.S. Pat. No. 6,586,781 to Wu et al. discloses methods and structures for reducing the trapping effect in GaN-based transistors. However, due to the high electric fields existing in these structures, charge trapping can still be a concern.

Field plates have been used to enhance the performance of GaN-based HEMTs at microwave frequencies and have exhibited performance improvement over non-field-plated devices [See S. Kamalkar and U. K. Mishra, *Very High Voltage AlGaN/GaN High Electron Mobility Transistors Using a Field Plate Deposited on a Stepped Insulator*, Solid State Electronics 45, (2001), pp. 1645-1662]. Many field plate approaches have involved a field plate connected to the gate of the transistor with the field plate on top of the drain side of a channel. This can result in a reduction of the electric field on the gate-to-drain side of the transistor, thereby increasing breakdown voltage and reducing the high-field trapping effect. However, transistors with gate-to-drain field plates can exhibit relatively poor reliability performance, particularly at class C (or higher class) operation where the electric field on the source side of the gate becomes significant.

It is well known that field plate approaches involving connecting the field plate to the source offer a reduction in gate-to-drain capacitance $C_{gd}$, which consequently can enhance the gain. In addition to minimizing capacitance, one goal in some applications is to improve linearity (i.e., the degree of proportionality between input and output) and reduce the drain bias dependence of the capacitance. While GaN-based HEMTs generally display good linearity, in some applications further improvement is desired (e.g., high power RF or and/or communication applications).

FIG. 1A shows a prior art transistor 10 having a field plate 28 connected to a source 22. The transistor 10 also includes a gate 26 which is on a barrier layer 18 and arranged between the source 22 and a drain 24, and within an insulating spacer layer 21. The barrier layer 18 is on a layer sequence including a 2DEG 20, a buffer layer 16, and a substrate 12. FIG. 1B is a chart showing the capacitance $C_{gd}$ as a function of drain voltage $V_d$ for a structure similar to the transistor 10. While this structure can have a reduced capacitance $C_{gd}$ compared to structures without a field plate, the capacitance $C_{gd}$ can still show a large dependence on the bias of the drain 24 as shown by FIG. 1B and shows a linearity with room for improvement.

One method of minimizing feedback capacitance while also improving linearity involves multi-stage arrangements. Transistors such as HEMTs can be combined in a two-stage cascade arrangement (using two of the same or different transistors). Some cascode arrangements including an initial non-field-plated common source stage and a second field-plated common gate stage are described in the commonly assigned U.S. Pat. No. 7,126,426 to Mishra et al. and entitled "Cascode Amplifier Structure Including Wide Bandgap Field Effect Transistor With Field Plates," which is fully incorporated by reference herein in its entirety. These devices can obtain the benefits of the field plate with little detrimental impact due to the feedback capacitance caused by the use of the field plate.

Multi-stage arrangements can also be achieved within a single dual-gate transistor, such as those described in U.S. Pat. No. 5,514,992 to Tanaka et al. In a dual-gate cascode transistor, the drain-to-source connection of a two transistor arrangement is replaced by the portion of the transistor between the two gates. FIG. 1C shows a prior art HEMT 11 with a dual-gate cascode arrangement including many of the same elements as the transistor 10 (like reference numerals are used to indicate like elements). The HEMT 11 includes a first stage gate 26 and a second stage gate 29 which are on the barrier layer 18 and arranged between the source 22 and drain 24. The second gate 29 can act as a shield for the first gate 26, and thus can reduce the feedback capacitance between the first gate 26 and drain 24, can reduce the drain voltage dependence of the capacitance, and can improve linearity.

In prior art dual-gate arrangements such as that shown in FIG. 1C, the first and second stages have the same threshold voltage. If the second gate in such an arrangement is grounded, then the current flow can be limited. Because of this, the second stage must be DC biased so as to avoid limiting the maximum current of the device. Some such devices are described in U.S. Pub. No. 2007/0290762 to Lin et al. However, separately biasing the second stage leads to added complexity and cost.

SUMMARY OF THE INVENTION

The present invention provides transistor structures with a field plate nearer the active semiconductor layers than prior art structures. One embodiment of a transistor according to the present invention includes a plurality of semiconductor layers and a gate between a source and a drain. The transistor comprises a field plate separated from a gate by a thicker portion of spacer layer and separated from the semiconductor layers by a thinner portion of spacer layer.

Another embodiment of a transistor according to the present invention comprises a spacer layer shaped to define an aperture, and a field plate at least partially within the aperture.

Yet another embodiment of a transistor according to the present invention comprises a spacer layer that separates a field plate from both semiconductor layers and a gate. The spacer layer has a thickness less than or equal to about 1500 Å.

These and other further features and advantages of the invention would be apparent to those skilled in the art from the following detailed description, taken together with the accompanying drawings, in which:

DETAILED DESCRIPTION OF THE INVENTION

Figure 1A:
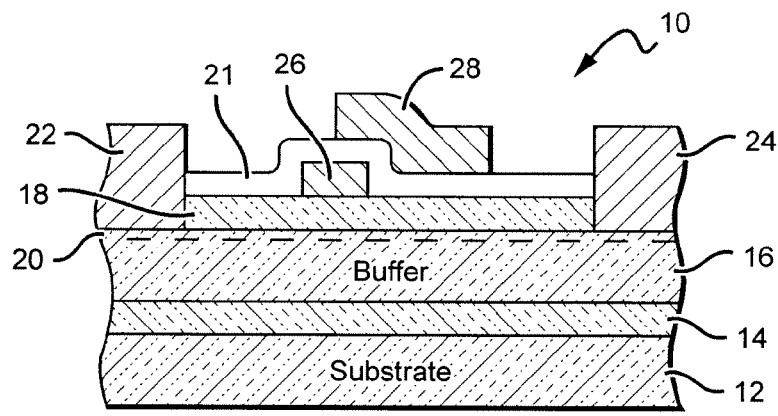
FIG. 1A is a cross-sectional view of one embodiment of a prior art transistor.
Figure 1B:
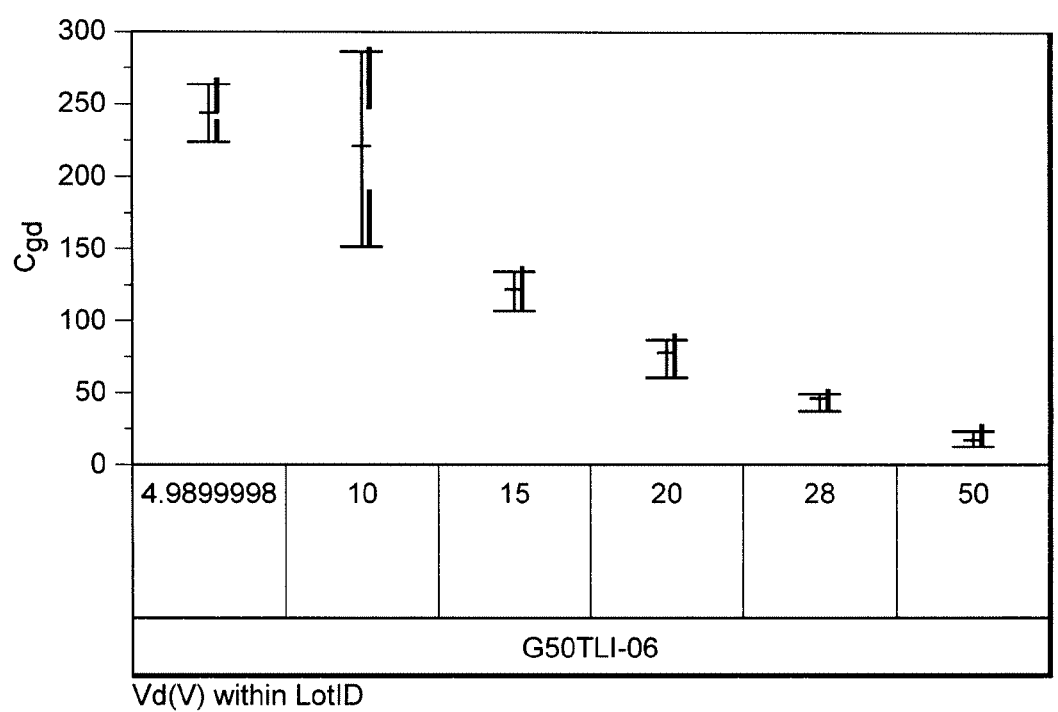
FIG. 1B is a graph of gate-to-drain capacitance as a function of drain voltage in a prior art transistor.
Figure 1C:
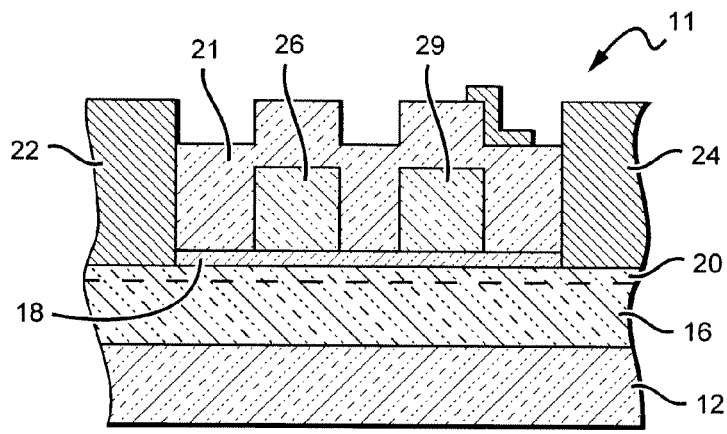
FIG. 1C is a cross-sectional view of another embodiment of a prior art transistor.

The present invention provides structures, such as a dual-gate transistor or HEMT cascode structure, that provide lower feedback capacitance and improved linearity at reduced complexity and cost. These structures, such as a GaN-based dual-gate HEMT, can provide high voltage, high current, and high gain operation with improved linearity. The present invention is generally directed to cascode structures wherein a second stage gate is separated from the barrier layer by a relatively thin spacer layer, causing the second stage to have a more negative threshold voltage than the first stage. In one embodiment, the second stage includes a cavity in a spacer layer which exposes the active region; a thin spacer layer is deposited over the active region, and the second stage gate fills the remainder of the cavity. The second stage gate can then be grounded, such as through a connection to the source, and the need for separately biasing the second stage gate is eliminated.

The present invention also provides transistor structures with a field plate placement which can improve the linearity of the transistor. Embodiments of the present invention are generally directed to transistor structures where a field plate is separated from the barrier layer by a relatively short distance, such as a relatively thin spacer layer. In some embodiments, the field plate can be separated from the active semiconductor layers by one spacer layer, while a thicker spacer layer can be maintained between the field plate and the gate. In another embodiment, a spacer layer can have variable thickness, with a relatively thin thickness between the field plate and the active semiconductor layers and a thicker thickness between the field plate and the gate.

In some embodiments, the field plate can be placed in an aperture within a spacer layer in order to lessen the distance between the field plate and the semiconductor layers. In some embodiments, the field plate can be separated from the semiconductor layers by a non-zero distance of about 1500 Å or less.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements. Further, terms such as "insulating" for example, can refer to materials that are fully insulating, semi-insulating, or that can be either.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending of the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the invention herein is for the purpose of describing particular embodiments only and is not intended to be limiting of the invention. As used in the description of the invention and the appended claims, the singular forms "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the invention are described herein with reference to cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the invention unless explicitly stated otherwise. Further, lines that appear straight, horizontal, or vertical in the below drawings for schematic reasons will often be sloped, curved, non-horizontal, or non-vertical. Further, while the thicknesses of elements are meant to be schematic in nature. For example, a thickness of a field plate may be completely within an aperture or the thickness of the field plate may be such that the field plate completely fills the aperture.

Unless otherwise defined, all terms used in disclosing embodiments of the invention, including technical and scientific terms, have the same meaning as commonly understood by one of ordinary skill in the pertinent art and are not necessarily limited to the specific definitions known at the time of the present invention. Accordingly, these terms can include equivalent terms that are created after such time. It is further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein.

Figure 2:
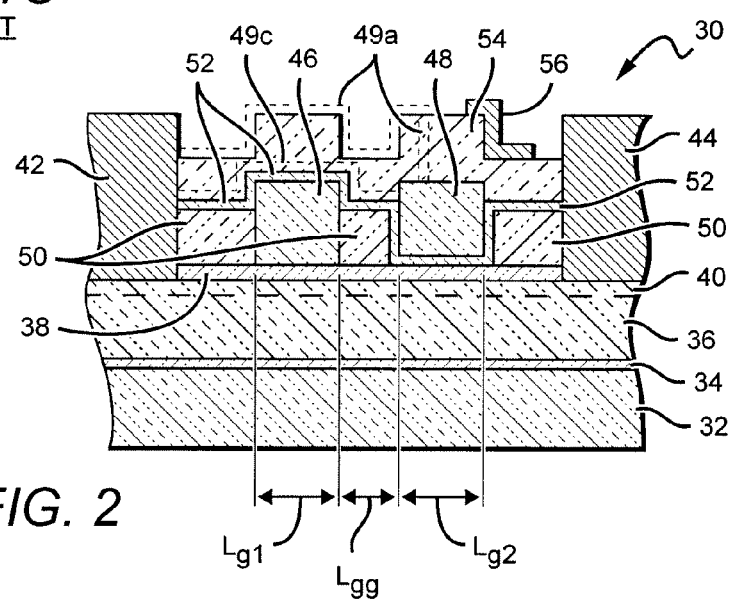
FIG. 2 is a cross-sectional view of one embodiment of a transistor according to the present invention.

FIG. 2 shows one embodiment of a HEMT 30 according to the present invention that is preferably Group-III nitride based, although other material systems can also be used. It should be noted that while the term HEMT is used herein for simplicity, the elements and concepts of the disclosed embodiments can be applied to many different types of transistors, including but not limited to Metal Semiconductor Field Effect Transistors (MESFETs) and Metal Oxide Semiconductor Heterostructure Field Effect Transistors (MOSHFETs). Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN.

The HEMT 30 can comprise a substrate 32 which can be made from silicon carbide, sapphire, spinet, ZnO, silicon, gallium nitride, aluminum nitride, or any other material or combinations of materials capable of supporting growth of a Group-III nitride material. A nucleation layer 34 can be formed on the substrate 32 to reduce the lattice mismatch between the substrate 32 and the next layer in the HEMT 30, although this nucleation layer is not mandatory. The nucleation layer 34 can be approximately 1000 angstroms (Å) thick, although other thicknesses can be used. The nucleation layer 34 can comprise many different materials, with a suitable material being $Al_zGa_{1-z}N$ ($0<=z<=1$), and can be formed on the substrate 32 using known semiconductor growth techniques such as Metal Organic Chemical Vapor Deposition (MOCVD), Hydride Vapor Phase Epitaxy (HVPE), or Molecular Beam Epitaxy (MBE).

The substrate 32 can be made of many different materials with a suitable substrate being a 4H polytype of silicon carbide, although other silicon carbide polytypes can also be used including 3C, 6H and 15R polytypes. Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible. SiC substrates are available from Cree, Inc., of Durham, N.C. and methods for producing them are set forth in the scientific literature as well as in a U.S. Pat. No. Re. 34,861 to Davis et al.; U.S. Pat. No. 4,946,547 to Palmour et al.; and U.S. Pat. No. 5,200,022 to Kong et al.

The formation of a nucleation layer 34 can depend on the material used for the substrate 32. For example, methods of forming a nucleation layer 34 on various substrates are taught in U.S. Pat. No. 5,290,393 to Nakamura and U.S. Pat. No. 5,686,738 to Moustakas, each of which are incorporated by reference as if fully set forth herein. Methods of forming nucleation layers on silicon carbide substrates are disclosed in U.S. Pat. No. 5,393,993 to Edmond et al., U.S. Pat. No. 5,523,589 to Edmond et al., and U.S. Pat. No. 5,739,554 to Edmond et al., each of which is incorporated herein by reference as if fully set forth herein.

The HEMT 30 can further comprise a buffer layer 36 which can have high resistivity formed on the nucleation layer 34. The buffer layer 36 can comprise doped or undoped layers of Group III-nitride materials with a preferred buffer layer 36 made of a Group III-nitride material such as $Al_xGa_yIn_{(1-x-y)}N$ ($0<=x<=1$, $0<=y<=1$, $x+y<=1$). Other materials can also be used for the buffer layer 36 such as GaN that is approximately 0.5-20 μm thick, and part or all of the buffer layer can be doped with Fe.

A barrier layer 38 is formed on the buffer layer 36 with the buffer layer 36 being sandwiched between the barrier layer 38 and the nucleation layer 34. Like the buffer layer 36, the barrier layer 38 can comprise doped or undoped layers of Group III-nitride materials. The barrier layer can be made of one or multiple layers of $Al_xGa_{1-x}N$ or $Al_xIn_yGa_{1-x-y}N$, where each of x and y ranges from 0-1 with exemplary values being 0, 0.2, 0.4, 0.5, 0.6, 0.8, and 1, and x and y can be a function of depth such that the barrier layer 38 can be a graded layer. A 2DEG channel layer 40 can be induced at the heterointerface between the buffer layer 36 and the barrier layer 38, and the buffer layer 36, 2DEG channel layer 40 and barrier layer 38 can generally form the HEMT active region.

Exemplary HEMT structures are illustrated in U.S. Pat. No. 6,316,793 to Sheppard et al., U.S. Pat. No. 6,586,781 to Wu et al., U.S. Pat. No. 6,548,333 to Smith and U.S. Published Patent Application Nos. 2002/0167023 to Prashant et al., and 2003/0020092 to Parikh et al., each of which is incorporated by reference as though fully set forth herein. Other nitride based HEMT structures are illustrated in U.S. Pat. No. 5,192,987 to Kahn et al. and U.S. Pat. No. 5,296,395 to Kahn et al., each of which is incorporated herein by reference as if fully set forth herein. The buffer and barrier layers 36,38 can be made using the same methods used to grow the nucleation layer 34. Electric isolation between the devices can be accomplished through mesa etch or ion implementation outside the active HEMT.

Source and drain electrodes 42, 44 can be formed in contact with the barrier layer 38. Electric current can flow between the source and drain electrodes 42, 44 through the 2DEG channel layer 40 between the buffer layer 36 and the barrier layer 38 when a gate is biased at the appropriate level. The formation of source and drain electrodes 42, 44 is described in detail in the patents and publications referenced above.

A first stage gate 46 can be formed on the barrier layer 38, and can be at least partially surrounded by and within an aperture of a first spacer layer 50. The first spacer layer 50 can be many different thicknesses, with some exemplary layers being between 100 nm and 2000 nm. A second stage gate 48 can also formed on the barrier layer 38 and within an aperture in the first spacer layer 50.

The gates 46,48 can have many different lengths ($L_{g1}$ and $L_{g2}$), with suitable gate lengths ranging from 10 nm to 1000 nm or approximately 500 nm, although other gate lengths can also be used. In one embodiment, $L_{g1}$ is shorter than $L_{g2}$; in another embodiment, the gate lengths are equal; in another embodiment, $L_{g1}$ is longer than $L_{g2}$. In the embodiment shown, the gates 46,48 can be side by side, which can reduce parasitic capacitance. The gates 46,48 can be separated by a distance $L_{gg}$, which allows the second gate 48 to shield the first gate 46 as previously described. The distance $L_{gg}$ can be many different values, with exemplary distances being between 10 nm and 2000 nm. In some embodiments $L_{gg}$ can range from 600 nm to 1200 nm which can provide easier fabrication, and in some embodiments $L_{gg}$ can be approximately 900 nm.

Figure 3:
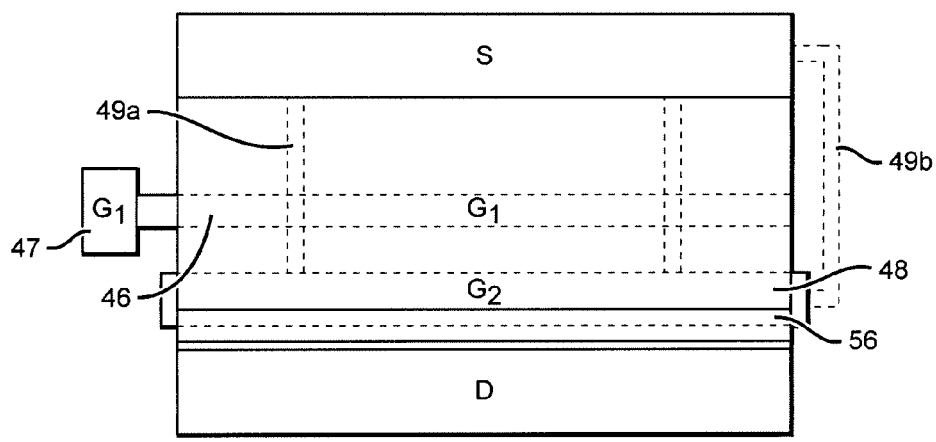
FIG. 3 is a plan view of the transistor shown in FIG. 2.

As best shown in the combination of FIG. 2 and FIG. 3, a plan view of the FIG. 2 embodiment, the first gate 46 can be contacted at a first gate contact 47. In a preferred embodiment, the second gate 48 can be connected to the source 42, although other connections including various ground connections are possible. This connection can be achieved in a number of manners. FIG. 3 shows two such manners, although other manners are possible. The second gate 48 can be connected to the source 42 by a series of conductive vias and/or buses 49a, which run through and/or on a third spacer layer 54 if such a layer is present. The third spacer layer 54 can be many different thicknesses, with one suitable range of thicknesses being approximately 100 nm to 1000 nm and another suitable range being approximately 150 nm to 500 nm, and in some embodiments the second spacer layer 54 can be 300 nm thick. The third spacer layer 54 can cover all of the active region between the drain 44 and source 42, can cover just the portion of the active region between either edge of the second gate 48 and the source 42, can cover just the portion of the active region between the furthest edge of a field plate 56 and the source 42 if such a field plate is present (to be discussed below), or can cover only the surface of the active region needed to support conductive buses (e.g., strips with only a width necessary to support such buses).

The buses of the via/bus system 49a can be on the topmost surface of the HEMT 30. One or more buses can be used, with the FIG. 2 embodiment including two buses. The greater the area covered by the buses, the greater the unwanted capacitance that can be introduced by the buses. The buses can have a sufficient number and width so that current effectively spreads between the source 42 and the second gate 48 while not covering too much of the HEMT active region. In one embodiment, the buses of the via/bus system 49a cover less than all of the HEMT active region. In one embodiment, the second gate 48 and source 42 are connected by a conductive path, such as the via/bus system 49a, covering less than all of the topmost surface of the HEMT 30, in this case the third spacer layer 54.

In one embodiment, the second gate 48 can be connected to the source 42 by a conductive path 49b running outside the active region of the HEMT 30. In the FIGS. 2 and 3 embodiment, the conductive path 49b is on the side opposite the gate contact 47, although in other embodiments the conductive path can be on the same side as the gate contact 47, or there can be two or more conductive paths running on one or both sides of the HEMT 30. Conductive paths running outside the active region can be used in many different embodiments, but can be particularly useful in embodiments where a spacer layer does not cover the active region between the second gate 48 and the source 42 (e.g., an embodiment without the third spacer layer 54).

Another connection manner can include a via/bus system 49c. The system 49c can include one or more buses which run on the surface of the second spacer layer 52. If present, the third spacer layer 54 can then cover the buses 49c. HEMTs according to the present invention can include one or multiple of the conductive paths 49a,49b,49c shown in the FIGS. 2 and 3 embodiment, or can include other connection means.

In the FIG. 2 embodiment of the present invention, a second spacer layer 52 can be between the second stage gate 48 and the barrier layer 38. The second spacer layer 52 can comprise many different insulating materials, including but not limited to dielectrics. The second spacer layer 52 can comprise the same or different materials than the first spacer layer 50. Some exemplary materials for spacer layers 50,52, 54 include, but are not limited to, SiN, $SiO_2$, Si, Ge, $MgO_x$, $MgN_x$, ZnO, $SiN_x$, $SiO_x$, $TiO_x$, and combinations or layer sequences thereof.

As previously discussed, in prior art dual gate HEMTs the second gate must be separately DC biased, which can lead to excessive expense and complexity. By including the second spacer layer 52, the threshold voltage of the second gate 48 can be made different than that of the first gate 46, and in one embodiment can be more negative than the threshold voltage of the first gate 46. Because of this, the second gate 48 can be DC grounded, such as through connecting the second gate 48 to the source 42 as described above. This can eliminate the need for separate biasing of the second gate 48, and thus can eliminate at least some of the cost and manufacturing difficulty of prior art devices. Devices with a layer such as the second spacer layer 52 can also exhibit improved linearity and lower capacitance than prior art HEMTs and/or cascode structures.

The thickness of the second spacer layer 52 can be chosen such that feedback capacitance remains nearly constant over a wide range of drain voltages, while at the same time not limiting the maximum current flow of the device. An insulator that is too thick can lead to inadequate shielding of the first stage and large drain voltage dependence, while an insulator that is too thin can limit the maximum current (and therefore RF power). The second spacer layer 52 can have many different thicknesses. In some embodiments, the thickness can be determined based on the dielectric constant of the material. In some embodiments, the non-zero thickness of the second spacer layer 52 is equal to or less than about 1500 Å and/or ranges from 50 Å to 1500 Å. In other embodiments, the non-zero thickness is equal to or less than 800 Å and/or ranges from 100 Å to 800 Å. In another embodiment, the thickness is approximately 300 Å to 600 Å and/or about 400 Å. One embodiment of a second spacer layer 52 according to embodiments of the present invention is a 100 Å to 800 Å and/or approximately 400 Å layer of SiN, $SiO_2$, or a combination thereof. Another embodiment of a second spacer layer 52 according to embodiments of the present invention is an 800-1500 Å layer of $TiO_x$, which has a higher dielectric constant.

The HEMT 30 can be fabricated in many different ways. The first spacer layer 50, second spacer layer 52, and third spacer layer 54 can be deposited using many deposition methods including but not limited to those deposition methods previously mentioned, with preferred methods being plasma chemical vapor deposition (PCVD) and atomic layer deposition (ALD). In one preferred method, the first spacer layer 50 is deposited over the entire top surface between the source 42 and drain 44, and the apertures in which the gates will be deposited are formed, such as by using reactive ion etching (RIE). The first gate 46 can then be formed before the deposition of the second spacer layer 52 over the entire top surface of the HEMT 30 between the source 42 and drain 44. Alternatively, the second spacer layer 52 can be deposited only in the region of the second aperture in which the second gate 48 will be formed, such as depositing the second spacer layer 52 such that it only covers the exposed surface of the barrier layer 38 or only covers the exposed surface of the barrier layer 38 and the side walls of the aperture. The second gate 48 can then be formed in the same aperture as the second spacer layer 52. The third spacer layer 54 can then be formed over the entire top surface of the HEMT 30 between the source 42 and drain 44, or can be deposited selectively in the areas described above.

As previously discussed, one or more field plates can optionally be used and can enhance device performance. Devices according to the present invention, such as the device shown in FIG. 2, are compatible with many different field plate arrangements. Some such field plate arrangements are discussed, for example, in the commonly assigned U.S. Pub. Nos. 2005/0253167, 2005/0253168, and 2006/0202272 to Wu et al., which are all fully incorporated by reference herein in their entirety. In the embodiment of FIGS. 2 and 3, a field plate 56 can be included on the third spacer layer 54 and can overlap the second gate 48. In other embodiments, the HEMT can include a space between the edge of the field plate and the edge of the second gate, or the field plate can cover the entire second gate. Examples of such field plate arrangements are described in the previously mentioned publications. In one embodiment, the field plate can be over the second gate 48 and/or between the second gate 48 and the drain 44. This can minimize the electric field at the edge of the second gate 48. Similar concepts are described in the commonly assigned U.S. Pat. No. 2005/0051800. In other arrangements, a field plate is provided between the source 42 and the first gate 46, over the first gate 46, and/or between the first and second gates 46,48. These field plates can also be used in combination with field plates over the second gate 48 and/or between the second gate 48 and the drain 44.

In a preferred embodiment, the field plate 56 can be connected to the source 42, although other arrangements are contemplated. The field plate 56 can be connected using structures similar to the conductive structure 49a,49b. For example, the field plate 56 can be connected to the source 42 by conductive buses covering less than all of the third spacer layer 54, a conductive path running outside the active region of the HEMT 30, a combination thereof, or many other conductive structures. Source-connected field plates with examples of appropriate conductive structures are described, for example, in U.S. Pub. No. 2005/0253167. Additionally, the HEMT 30 can include more than one field plate. In one such arrangement, each of the multiple field plates can be either at least partially over the second gate or between the second gate and the drain. Some appropriate multiple field plate structures are described, for example, in U.S. Pub. No. 2005/0253168.

Figure 4:
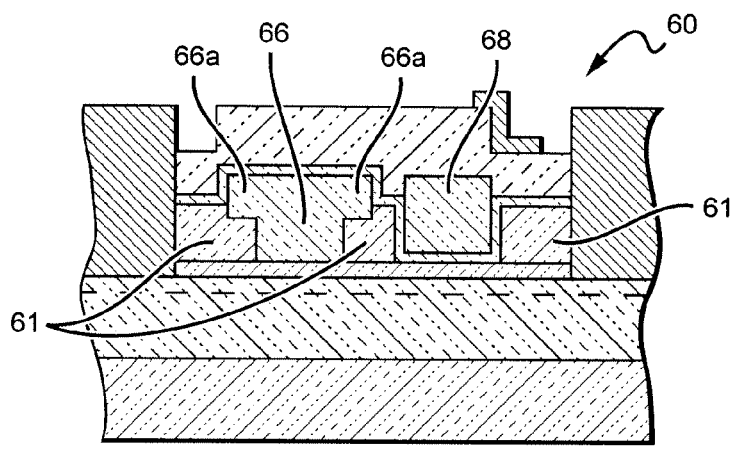
FIG. 4 is a cross-sectional view of another embodiment of a transistor according to the present invention.

While the gates 46,48 shown in FIG. 2 are shown as rectangular, many different gate shapes are possible. FIG. 4 shows an embodiment of an HEMT 60 according to the present invention that includes a T-shaped first gate 66. The gate 66 includes overhanging sections 66a. The area below the overhanging sections 66a can be left empty, can be partially or entirely filled by a portion of the first spacer layer 61, or can be partially or entirely filled by another material or layer. In the FIG. 4 embodiment, this area can be entirely filled by a portion of the first spacer layer 61. The device 60 with the T-shaped gate 66 can be particularly adapted for high frequency operation. Gate length is an important device dimension in determining device speed, and with high frequency devices gate length is typically shorter. Shorter gate length can lead to high resistance that can negatively impact high frequency operation. By including the overhanging sections 66a, the upper portion of the gate 66 has a larger cross-section than the lower portion. This can result in lower resistance and enhanced gate conductance.

Figure 5:
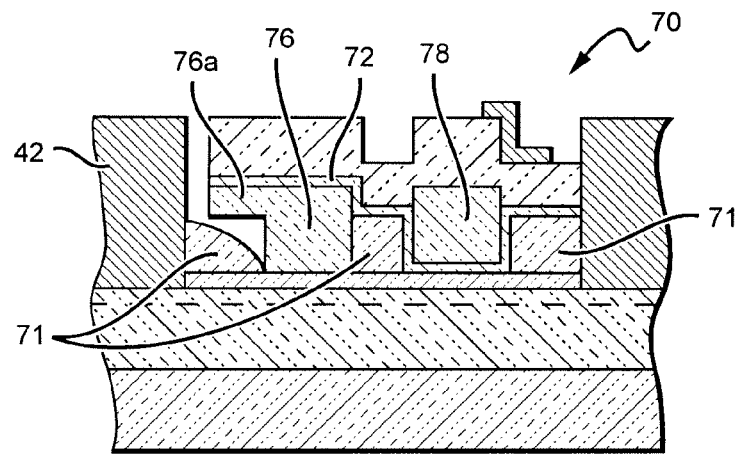
FIG. 5 is a cross-sectional view of another embodiment of a transistor according to the present invention.

FIG. 5 shows an embodiment of an HEMT 70 according to the present invention that includes a gamma shaped first gate 76 instead of the T-shaped gate 66. The area below an overhanging section 76a can be left empty, can be filled by a portion of the first spacer layer 71, or can be filled by another material or layer. In the embodiment shown, the space is partially filled by the first spacer layer 71. Including a space below the overhanging section 76a can reduce capacitance between the first gate 76 and the source 42.

The overhanging sections 66a,76a can be made of the same or different materials than the remainder of the gates 66,76, and can be fabricated using many different methods. For example, overhanging sections can be fabricated using photo-resist techniques, and in one embodiment a photo-resist layer can be included on the first spacer layer and the overhanging section(s) formed on the photo-resist layer. Subsequent removal of the photo-resist layer can leave a space between the spacer layer and the overhanging section(s).

While the gates 66 and 76 are generally T-shaped and gamma shaped, respectively, it is understood that many different shapes are possible. One objective of including gates with these shapes is to include a section to improve conductivity to allow for higher frequency operation, with the section being enlarged to achieve this objective. Having a particular shape to the enlarged top portion may not be critical. The length of the overhangs 66a,76a can vary, with suitable lengths ranging from about 0.2 μm to about 4 μm, although other lengths can also be used. Further, while the embodiments of FIGS. 4 and 5 include T-shaped and gamma shaped first gates 66,76, other embodiments of the present invention include a T-shaped or gamma shaped second gate, or include a T-shaped or gamma shaped first gate and a T-shaped or gamma shaped second gate. If the second gate is T-shaped or gamma shaped, at least the bottom portion which would otherwise be directly on the barrier layer can be covered by a spacer layer 72 similar to or the same as the second spacer layer 52 from FIG. 2.

In addition to the T-shaped and gamma shaped gates 66,76 of FIGS. 4 and 5, many other gate shapes are possible. For example, gates with polygon cross-sections such as hexagonal, octagonal, and trapezoidal gates, for example, are possible. In one embodiment of an HEMT with one or more hexagon gates, the first spacer layer rises to the level of the midpoint of the hexagon. Another shaped gate has one or more overhangs like a T-shaped or gamma shaped gate, with a lower gate portion that tapers inward or outward as it rises to the upper portion of the gate.

Figure 6:
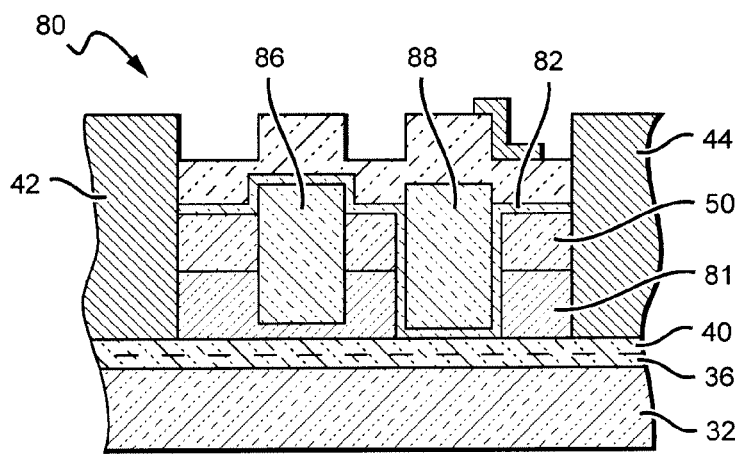
FIG. 6 is a cross-sectional view of another embodiment of a transistor according to the present invention.

Embodiments of HEMTs according to the present invention can also include one or more recessed gates. FIG. 6 shows an embodiment of a transistor according to the present invention similar to the HEMT 30 from FIGS. 2 and 3 (like reference numerals are used to indicate equivalent elements), but with recessed first and second gates 86,88. The gates 86,88 are recessed into the barrier layer 81. This recessed area can be formed at the same time as the apertures in the first spacer layer 50. In this embodiment, the second spacer layer 82 can cover at least the bottom of the second gate 88 and the side portions of the gate 88 within the recess in the barrier layer 81. The second spacer layer 82 can be the same or similar materials and thickness as the second spacer layer 52 from FIGS. 2 and 3. While the gates 86,88 are shown as only partially recessed into the barrier layer 81, each of the gates 86,88 could be fully recessed or different portions could be recessed to different depths in the barrier layer 81. Additionally, the gates 86,88 do not both need to be recessed, or can be recessed differently. Recessed T-shaped gates and gamma shaped gates are also possible, where part or all of the lower portion of the gate (e.g. the portion from the bottom of the overhang(s) and below) can be recessed into the barrier layer.

Figure 7:
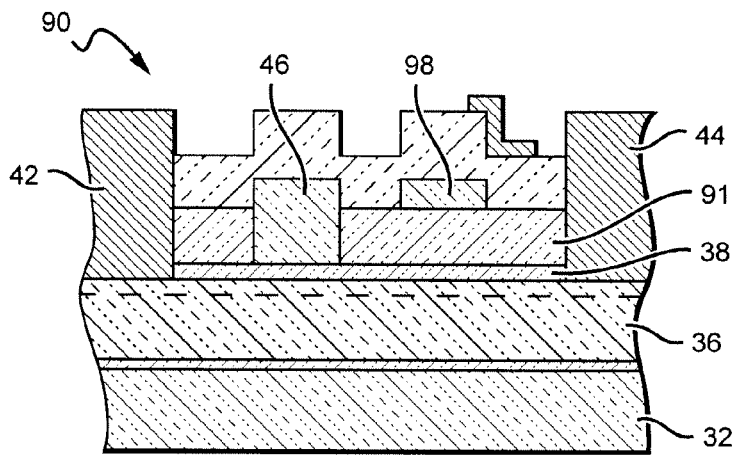
FIG. 7 is a cross-sectional view of another embodiment of a transistor according to the present invention.

FIG. 7 shows another embodiment of a device according to the present invention. The HEMT 90 is similar to the HEMT 30 from FIGS. 2 and 3 in many respects. The HEMT 90 comprises a first gate 46 and a second gate 98. Similar to the first gate in the HEMT 30, the first gate 46 in the HEMT 90 is formed in an aperture in a first spacer layer 91, such that the first gate 46 is in contact with the barrier layer 38. However, in the HEMT 90 the second gate is formed on a top surface of the first spacer layer 91 instead of in an aperture in the first spacer layer 91. The first spacer layer 91 can be made of any of the spacer layer materials previously discussed. The HEMT 90 may produce a higher parasitic capacitance $C_{gd}$ than the HEMT 30 of FIGS. 2 and 3, such as for example at low drain voltages, but can have reduced cost and difficulty of manufacture.

Figure 8:
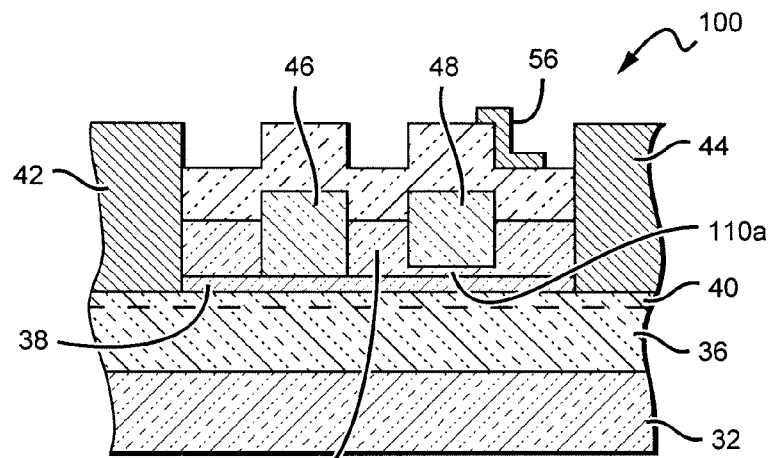
FIG. 8 is a cross-sectional view of another embodiment of a transistor according to the present invention.

FIG. 8 shows another embodiment of a device according to the present invention. The HEMT 100 is similar in many respects to the HEMT 30 shown in FIGS. 2 and 3 and described above. The HEMT 100 comprises a first gate 46 and a second gate 48. However, an insulating layer such as the second spacer layer 52 from FIG. 2 can be excluded from the HEMT 30. The second gate 48 can instead be separated from the barrier layer 38 by a thin section 110a of the first spacer layer 110. The first spacer layer 110 can be made of the same materials as the first spacer layer 50 from FIG. 2, and excluding the thin section 110a can have the same or similar thickness as the first spacer layer 50. The thin section 110a can have the same or similar thickness as the second spacer layer 52 from FIG. 2. One possible manufacturing method of the HEMT 100 includes placing a first gate 46 on or in the barrier layer 38, depositing the first spacer layer 110, and then etching a portion of the first spacer layer 110 to form the thin section 110a before depositing the second gate 48 on the thin section 110a. Alternatively, the first spacer layer 110 can be deposited before the first gate 46, and an aperture can be etched all the way to the barrier layer 38 to allow for placement of the first gate 46. The first spacer layer 110 can also be partially etched to form a second aperture, with the thin section 110a remaining, for placement of the second gate 48. The remainder of the structure can be fabricated as described above.

Figure 9:
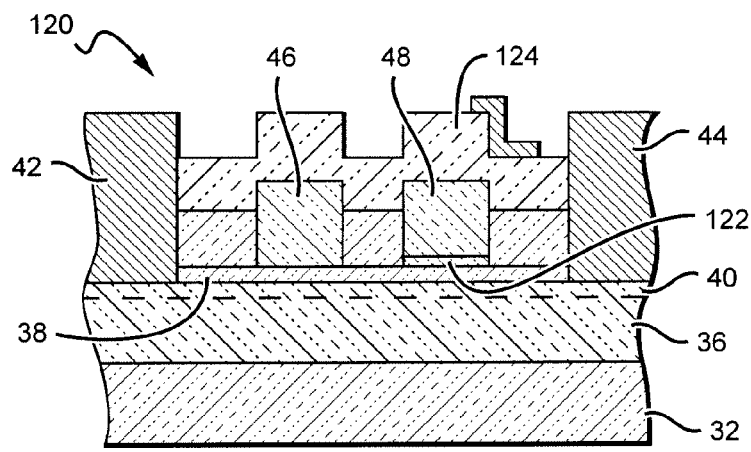
FIG. 9 is a cross-sectional view of another embodiment of a transistor according to the present invention.

FIG. 9 shows another embodiment of a device according to the present invention. The HEMT 120 is similar in many respects to the HEMT 100 shown in FIG. 8 and described above. In this embodiment, a first spacer layer 122 can be deposited in the region where the second gate 48 is to be placed (instead of, for example, depositing the first spacer layer 122 across the entire cross-section from the source 42 to the drain 44). The second gate 48 can then be placed on the first spacer layer 122 and the first gate 46 can be placed on the barrier layer 38. A second spacer layer 124 can then be deposited over both the first and second gates 46,48 with the remainder of the device being fabricated as described above.

While the above embodiments show dual-gate transistor structures, elements of the above embodiments can be applied to other structures. For example, one example of a cascode structure according to the present invention includes a cascode amplifier structure as described in the commonly assigned U.S. Pub. No. 2005/0051800 including two separate single-gate transistors, with a spacer layer similar to the second spacer layer 52 incorporated into the downstream of the two transistors.

The above embodiments and variations thereof can also be utilized in many different ways. For example, the cascode structures can function as amplifiers, similar to those described in U.S. Pat. App. No. 2005/0051800. The above embodiments can also function as part of a larger system. For example, the above embodiments can function within integrated circuits such as monolithic microwave integrated circuits (MMICs).

Figure 10:
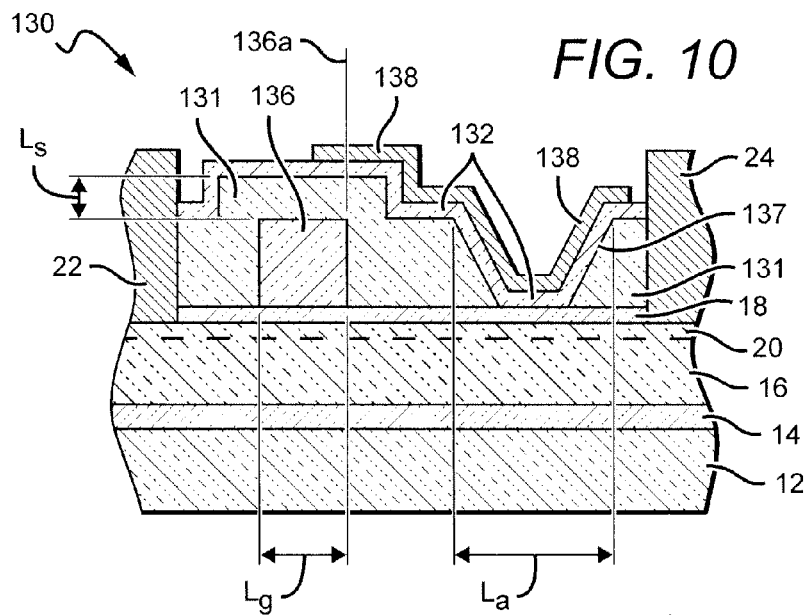
FIG. 10 is a cross-sectional view of another embodiment of a transistor according to the present invention.

FIG. 10 shows another embodiment of a device according to the present invention. The HEMT 130 can be similar to the HEMT 10 from FIG. 1A, and contain similar elements (marked with equivalent reference numerals). The HEMT 130 can include a gate 136 which can be surrounded by a first spacer layer 131. The gate 136 can have a gate length $L_g$ that can vary, with suitable gate lengths ranging from 10 nm to 1000 nm or approximately 400 nm, although other gate lengths can be used. In the HEMT 130, at least a portion of the spacer layer 131 can cover the gate 136, although in other embodiments the first spacer layer does not cover the gate.

An aperture 137 can be formed within the first spacer layer 131. The aperture 137 can have a length $L_a$ similar in length to $L_g$, with one preferred embodiment having a length of approximately 500 nm. In one embodiment, $L_g$ is shorter than $L_a$. In one such embodiment $L_g$ is approximately 400 nm and/or $L_a$ is approximately 500 nm. In another embodiment, $L_g$ and $L_a$ are equal. In yet another embodiment, $L_g$ can be larger than $L_a$. While FIG. 10 shows an embodiment having a single aperture 137, multiple apertures are possible.

The aperture 137 can expose a portion of the barrier layer 18. A second spacer layer 132 can at least partially, and in some embodiments fully, cover the portion of the barrier layer 18 exposed by the aperture 137. The second spacer layer 132 can have many of the same attributes as the second spacer layer 52 from FIG. 2, including having similar or the same thicknesses and materials. In some embodiments, the non-zero thickness of the second spacer layer 132 is equal to or less than about 1500 Å or ranges from 50 Å to 1500 Å. In other embodiments, the non-zero thickness is equal to or less than 800 Å and/or ranges from 100 Å to 800 Å. In another embodiment, the thickness is approximately 300 Å to 600 Å and/or about 400 Å. One embodiment of a second spacer layer 132 according to embodiments of the present invention is a 100 Å to 800 Å and/or approximately 400 Å layer of SiN, SiO$_2$, or a combination thereof, although other materials are possible. Another embodiment of a second spacer layer 132 according to embodiments of the present invention is an 800-1500 Å layer of TiO$_x$, which has a higher dielectric constant. If a second aperture is present, a thicker spacer layer can be present in the aperture nearer the gate, with one exemplary thickness of a spacer layer being 1000 Å.

The second spacer layer 132 can be deposited selectively, such that the second spacer layer 132 only covers the exposed portion of the barrier layer 18, or such that the second spacer layer 132 only covers the exposed portion of the barrier layer 18 and the sidewalls of the aperture 137. Alternatively and in the embodiment shown in FIG. 10, the second spacer layer can be deposited across the entire distance between the source 22 and the drain 24 for ease of manufacture. The combination of the first spacer layer 131 and the second spacer layer can provide a larger separation distance between the field plate 138 and the gate 136 than exists between the field 138 and the active semiconductor layers, such as the barrier layer 18. In other embodiments, something other than a spacer layer can provide one or both of these separations.

The HEMT 130 can also include a field plate 138. In the embodiment shown the field plate 138 is at least partially, and sometimes fully, between the gate 136 and the drain 24, although other embodiments are contemplated. The field plate 138 can at least partially cover the bottom portion of the aperture 137, and thus the portion of the second spacer layer 132 on the barrier layer 18 can at least partially be sandwiched between barrier layer 18 and the field plate 138. In other embodiments, the portion of the second spacer layer 132 is at least partially sandwiched between another active semiconductor layer and the field plate 138. In one embodiment the field plate 138 can cover at least the entire bottom of the aperture 137, as shown in FIG. 10, although other embodiments are contemplated. The field plate 138 can extend past the bottom and up the side of the aperture 137 and further toward the drain 24, as shown in the FIG. 10 embodiment, and in one such embodiment extends toward the drain 24 on the first spacer layer 131 outside of the aperture 137. In some transistors, an electric field can peak at the edge of a field plate. Embodiments where the field plate, such as the field plate 138, extends past the floor of the aperture 137 and up the drain-side of the aperture 137 can have decreased trapping and a lesser chance of breakdown. One explanation for this is that the edge of the field plate 138 is separated from the barrier layer 18 by a larger distance. In one such embodiment the field plate 138 can extend outside the aperture 137 and toward the drain 24 over the first spacer layer 131. Embodiments with a field plate extending past the edge of the aperture can be more easily manufactured.

In the conventional prior art HEMT 10 from FIG. 1A, the field plate 28 is on the first spacer layer 21, which can limit how close the field plate 28 can be deposited to the active semiconductor layers. In the HEMT 130, due at least in part to the presence of the aperture 137 in the first spacer layer 131, at least a portion of the field plate 138 is separated from the active semiconductor layers by only the second spacer layer 132. As discussed above, the second spacer layer 132 can have a thickness less than that of the first spacer layer 131 or the first spacer layer 21 from FIG. 1A. By reducing the insulator thickness separating the field plate 138 from the active semiconductor layers, the drain bias dependence of the parasitic capacitance $C_{gd}$ can be reduced. This can result in higher device linearity.

The field plate 138 can also extend toward the gate 136. In the embodiment shown, the field plate 138 extends past the nearest edge 136a of the gate 136. This arrangement can provide ease of manufacturing over other embodiments where a gap can be left between a gate and a field plate. Many other gate/field plate arrangements are possible, including the arrangements disclosed in the commonly assigned U.S. Pat. No. 7,550,783 to Wu at al. and entitled "Wide Bandgap HEMTs with Source Connected Field Plates," U.S. Pat. Pub. No. 2005/0253167 to Wu at al. and entitled "Wide Bandgap Field Effect Transistors with Source Connected Field Plates," and U.S. Pat. Pub. No. 2006/0202272 to Wu et al. and entitled "Wide Bandgap Transistors with Gate-Source Field Plates", all three of which are fully incorporated by reference herein in their entirety. In some embodiments, the edge of the field plate 136 can be even with the edge 136a of the source, or the field plate 136 can stop short of extending to the edge 136a. Some alternative field plate arrangements will be discussed in detail below.

Some embodiments of transistors according to the present invention can include a relatively thin insulating layer (e.g., the second spacer layer 132) separating a field plate (e.g., the field plate 138) from a barrier layer, while still maintaining a relatively thick insulating layer or layers between the field plate and the gate. Such embodiments can generate the advantages of having a field plate near the active semiconductor layers, such as reducing the drain bias dependence which can increase linearity, while avoiding or reducing the complications of the field plate being too near the gate (e.g., avoiding a reduction in the breakdown voltage of the device). In the FIG. 10 embodiment, the field plate 138 is separated from the gate 136 by a portion of the first spacer layer 131 having a thickness $L_s$ in addition to a portion of the second spacer layer 132. The thickness $L_s$ can have many different values, with exemplary thicknesses being between 100 Å to 2000 Å, although other thicknesses are possible. In one embodiment, the thickness $L_s$ can be between 400 Å and 1200 Å, with one exemplary thickness being approximately 800 Å. If the thickness $L_s$ is chosen properly, some or all of the benefits of a second field plate can be realized without actually depositing the second field plate, leading to a reduction in manufacturing difficulty and cost.

In a preferred embodiment, the field plate 138 is connected to the source 22, although other connections are possible. The connection to the source 22 can be achieved in a number of manners, including but not limited to those described above with regard to connecting the second gate of FIG. 3 to the source. For example, the field plate 138 can be connected to the source 22 can be connected to the source using a via/bus system. If the field plate 138 is on the top surface of the transistor, then one embodiment uses only buses. Conductive buses connecting the field plate 138 to the source 22 can be on the topmost surface of the HEMT 130. One or more buses can be used, with one embodiment including two buses. The greater the area covered by the buses, the greater the unwanted capacitance that can be introduced by the buses. The buses can have a sufficient number and width so that current effectively spreads between the source 22 and the field plate 138 while not covering too much of the HEMT active region. In one embodiment, the buses cover less than all of the HEMT active region. In one embodiment, the buses cover less than all of the topmost surface of the HEMT 130.

In one embodiment, the field plate 138 can be connected to the source 22 by a conductive path running outside the active region of the HEMT, similar to or the same as the conductive path 49b shown in FIG. 3. Conductive paths running outside the active region can be used in many different embodiments, but can be particularly useful in embodiments where a spacer layer does not cover the active region between the field plate 138 and the source 22 and/or in embodiments using a gamma or T-shaped gate. Any combination of connection means can be used.

Devices according to the present invention can be manufactured using many different methods. After the formation of the source 22, gate 136, and drain 24, the first spacer layer 131 can be deposited using one of many deposition and/or growth techniques, such as PECVD (Plasma Enhanced Chemical Vapor Deposition). If necessary, the first spacer layer 131 can be patterned such that it remains principally on the active region of the HEMT 130, such that the source 22, gate 136, and drain 24 are available for contact. The first spacer layer 131 can then be etched to form the aperture 137; this step can be performed using, for example, a photo resist and/or any dry or wet etch process, although other processes are possible. The field plate 138 can then be deposited, such as by metal evaporation or many other methods. If necessary, additional spacer layers and/or field plates can be produced over the device shown in FIG. 10. This represents only one method of manufacturing the HEMT 130, as many other methods are possible. Some exemplary methods are described in U.S. Pat. No. 7,812,369 to Chini et al. and entitled "Fabrication of Single or Multiple Gate Field Plates," which is fully incorporated by reference herein in its entirety.

The device shown in FIG. 10, as well as the devices shown in FIGS. 11-17, can exhibit characteristics similar to two transistor structures such as cascode structures, and/or can exhibit characteristics similar to the transistor structures shown above in FIGS. 2-9. The drain bias applied across the entire transistor can be distributed between a common source first stage and a common second gate stage. The common gate stage which can be formed through the inclusion of the field plate can absorb drain feedback capacitance $C_{gd}$ or shield the first stage from this capacitance across a wide range of drain biases, and can also increase linearity. As the distance between the field plate and the semiconductor layers is lowered, the threshold voltage of the second stage can be lowered, which can allow the common gate stage to shield $C_{gd}$ at lower values of drain bias.

Figure 11:
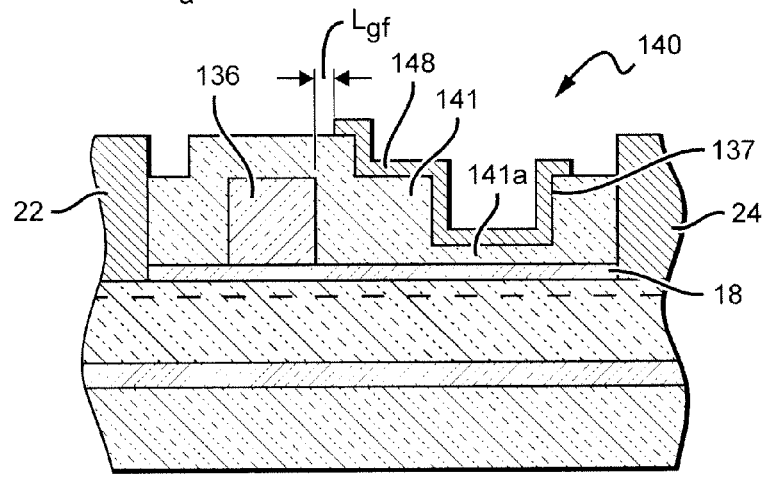
FIG. 11 is a cross-sectional view of another embodiment of a transistor according to the present invention.

FIG. 11 shows another embodiment of a device according to the present invention. The HEMT 140 is similar in many respects to the HEMT 130 shown in FIG. 10 and described above. An insulating layer such as the second spacer layer 132 from FIG. 2 can be excluded from the HEMT 140. The field plate 148 can instead be separated from the barrier layer 18 by a thin section 141a of the first spacer layer 141. The first spacer layer 141 can be made of the same materials as the first spacer layer 50 from FIG. 2. The thin section 141a can have the same or similar thickness as the second spacer layer 132 from FIG. 10. One possible manufacturing method of the HEMT 140 is very similar to the manufacturing method described above for the HEMT 100 from FIG. 8, but includes depositing the field plate 138 in the aperture 137 instead of the second gate of FIG. 8.

FIG. 11 also shows a gate/field plate arrangement that differs from the FIG. 10 embodiment. In the FIG. 11 embodiment, the field plate 148 does not extend over the gate, but instead is separated from the edge of the gate by a distance $L_{gf}$. The distance $L_{gf}$ between the edge of the field plate 148 and the edge of the gate 146 can be wide enough to isolate the field plate 148, while being small enough to maximize the field effect provided. If $L_{gf}$ is too wide the field effect can be reduced. In one embodiment, $L_{gf}$ can be approximately 0.4 microns or less, although larger and smaller values are possible. While the FIG. 11 embodiment includes a distance $L_{gf}$, the arrangement discussed above with regard to a thin section 141a of the first spacer layer 141 can be used with any gate/field plate arrangement, including an arrangement where the field plate overlaps the gate. Further, while the aperture 137 in FIGS. 11-14, 16, and 17 are shown with vertical sidewalls, this is purely schematic, as sidewalls in any of these embodiments can be vertical, sloped, or a combination thereof. Sloped sidewalls can improve field plate deposition.

Figure 12:
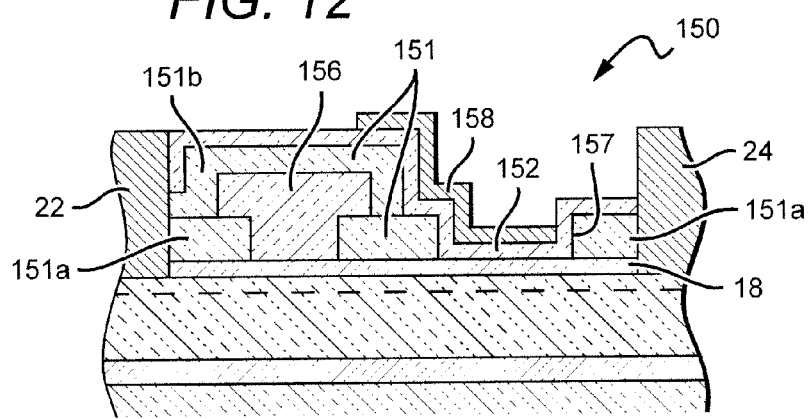
FIG. 12 is a cross-sectional view of another embodiment of a transistor according to the present invention.

FIG. 12 shows another embodiment of a device according to the present invention. The HEMT 150 can include a T-shaped gate 156. While the FIG. 12 embodiment shows a T-shaped gate 156, many other shaped gates are possible, including but not limited to other gate shapes including overhangs such as a gamma shaped gate. A first section 151a of a first spacer layer 151 fills the areas below the overhangs of the gate 156. The first spacer layer 151 can have many of the same characteristics as the first spacer layer 131 from FIG. 10, including having the same or similar thicknesses and/or materials. A second section 151b of the first spacer layer 151 can be deposited selectively over the T-shaped gate 156, or can be deposited over the entire length between the source 22 and the drain 24. The second section 151b can be made of the same or different materials than the first section 151a. One method of manufacture includes depositing the first section 151a of the first spacer layer 151, etching an aperture to allow for the deposition of the T-shaped gate 156, and then depositing the second section 151b of the first spacer layer 151 over the T-shaped gate 156. A second aperture 157 can be formed in the first spacer layer 151a to allow for placement of the field plate 158.

The second section 151b (and, if present over the gate 156 and as shown in FIG. 12, the second spacer layer 152) can serve to separate the gate 156 from the field plate 158, which can achieve the benefits previously discussed. The second section 151b can have a thickness the same as or similar to the thickness $L_3$, discussed above with regard to FIG. 10. Thus, the field plate 158 can be separated from the gate 156 by a greater distance than the barrier layer 18, allowing for isolation between the field plate 158 and gate 156 while realizing the benefits of having the field plate 158 near the barrier layer 18.

Many variants on the FIG. 12 embodiment are possible. For instance, in the embodiment shown, since the second section 151b is only deposited selectively over the T-shaped gate 156, only the first section 151a needs to be etched to allow for deposition of the second spacer layer 152 and the field plate 158 on the barrier layer 18. Alternatively, as shown in FIG. 11, the first section 151a could be etched such that only a thin section remained, and the thin section could serve the same functional purpose as the second spacer layer 152. Alternatively, the second section 151b could be deposited over the entire area between the source 22 and drain 24. In one such embodiment, the second section 151b could be etched to leave only a thinned portion, which could serve the same functional purpose as the second spacer layer 152. In another variant on the FIG. 12 embodiment, a space is left beneath the overhang(s) of a shaped gate, as discussed above with regard to FIG. 5.

Figure 13:
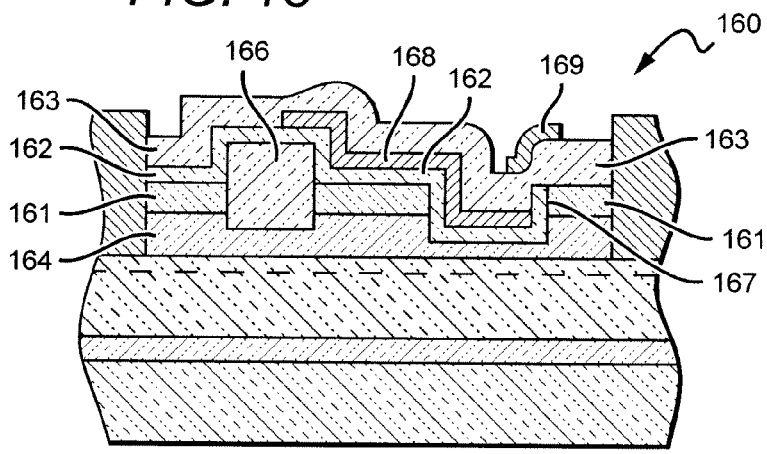
FIG. 13 is a cross-sectional view of another embodiment of a transistor according to the present invention.

FIG. 13 shows another embodiment of a device according to the present invention. The HEMT 160 includes first and second spacer layers 161,162. The second spacer layer 162 can be similar to or the same as the second spacer layer 132 from FIG. 10 in many respects, including but not limited to material and thickness. In the embodiment shown, the first spacer layer 161 may not cover the gate 166. In such embodiments, the first field plate 168 may only be isolated from the gate 166 by the second spacer layer 162. This arrangement can provide a reduction in manufacturing difficulty and cost, as the first spacer layer does not necessarily need to be arranged on top of the gate 166.

In addition to first and second spacer layers 161,162 and a first field plate 168, the transistor 160 can include a second field plate 169, which can be on a third spacer layer 163. The third spacer layer 163 can cover the entire first field plate 168, as shown in FIG. 13. Alternatively, the third spacer layer 163 should cover enough of the first field plate 168 to provide isolation between the first and second field plates 168,169. The first and second field plates 168,169 can overlap as shown in FIG. 13, or there can be a gap between the edges of the first and second field plates 168,169. The first and second field plates 168,169 can both be connected to the source using any of the connection means previously described, although other arrangements including gate connections are contemplated. This multiple field plate arrangement can further reduce the peak electric field in the device, resulting in increased breakdown voltage and reduced trapping. Multiple field plate arrangements are discussed in detail in the commonly assigned U.S. Pub. No. 2005/0253168 to Wu et al. and entitled "Wide Bandgap Transistors with Multiple Field Plates," and U.S. Pub. No. 2006/0202272 to Wu et al. and entitled "Wide Bandgap Transistors with Gate-Source Field Plates," each of which is fully incorporated by reference herein in its entirety. These field plate arrangements can be utilized in any of the embodiments discussed herein, and may be particularly useful when a first spacer layer (e.g., the first spacer layer 161 from FIG. 13) does not cover the gate such that only a second spacer layer (e.g., the second spacer layer 162) separates the gate and field plate.

Embodiments of the present invention can also include a gate and/or a field plate which are recessed into the barrier layer. The gate 166 from FIG. 13 can be recessed into the barrier layer 164 in an arrangement similar to or the same as the gate 86 and the barrier layer from FIG. 6. The HEMT 160 also includes a field plate which is recessed into the barrier layer 164. In the embodiment shown, an aperture 167 in the first spacer layer 161 in which parts of the second spacer layer 162 and the first field plate 168 can be placed is partially recessed into the barrier layer 164. The second spacer layer 162 and first field plate 168 can therefore be recessed into the barrier layer 164, with the second spacer layer 162 sandwiched between the first field plate 168 and the barrier layer 164. The second spacer layer 162 can cover at least the bottom of the aperture 167 and the sides of the section of the aperture 167 recessed into the barrier layer 164.

Figure 14:
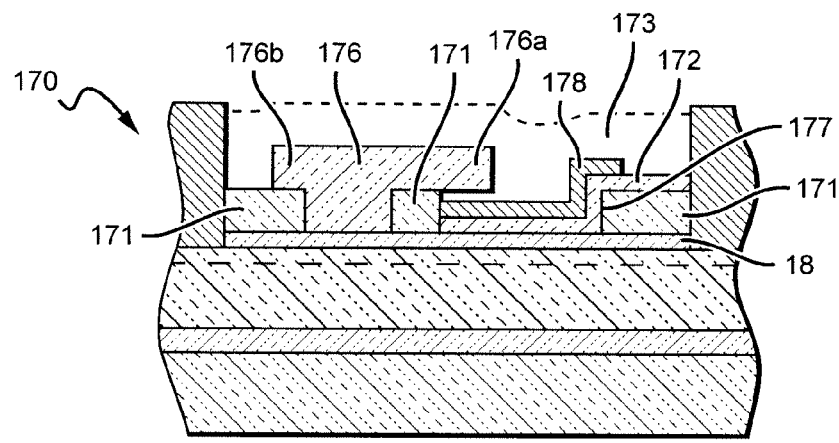
FIG. 14 is a cross-sectional view of another embodiment of a transistor according to the present invention.

Embodiments of the present invention can also include buried field plates, or field plates which are at least partially, and sometimes fully, located under a gate overhang. FIG. 14 shows another embodiment of a device according to the present invention. The device 170 includes a T-shaped gate 176 with one overhang 176a longer than the other overhang 176b, although other gate shapes including at least one overhang can also be used. An aperture 177 can be formed in a first spacer layer, where a second spacer layer 172 and a field plate 178 can be at least partially deposited. The second spacer layer 172 can be similar to or the same as the second spacer layer 132 from FIG. 10 in many ways, including but not limited to material and thickness. The second spacer layer 172 can separate the field plate 178 from the barrier layer 18. As shown in FIG. 14, the field plate 178 can be deposited at least partially under the overhang 176a, and can be connected to the source using any of the connection means previously described. One particularly applicable connection means includes a connection running outside the active region of the transistor 170.

In some embodiments of the present invention, an aperture 177 in a first spacer layer 171 and/or a field plate 178 can be located completely under a gate overhang. In one embodiment, a space remains between the field plate 178 and the gate overhang 176a. In another embodiment, a third spacer layer 173 (shown in phantom) can be deposited such that it occupies the space between the bottom of the gate overhang 176a and the field plate 178. The third spacer layer 173 can also cover the entire structure between source and drain, as shown in FIG. 14.

While in the FIG. 14 embodiment a portion of the first spacer layer 171 remains under the overhang 176a, in other embodiments no section of the spacer layer 171 remains under the overhang 176a. In such embodiments, the field plate 176 can still be isolated from the gate 176, such as by leaving one or more gaps between the field plate 178 and the gate 176, for example.

Buried field plate arrangements such as those described above can result in a reduced peak electric field, gate-to-source capacitance, and gate-to-drain capacitance, while also increasing gate conductance. Some buried field plate arrangements which can be incorporated into embodiments of the present invention are discussed generally in commonly assigned U.S. Pat. Pub. No. 2008/0128752 to Wu and entitled "GaN Based HEMTs with Buried Field Plates," which is fully incorporated by reference herein in its entirety.

Figure 15:
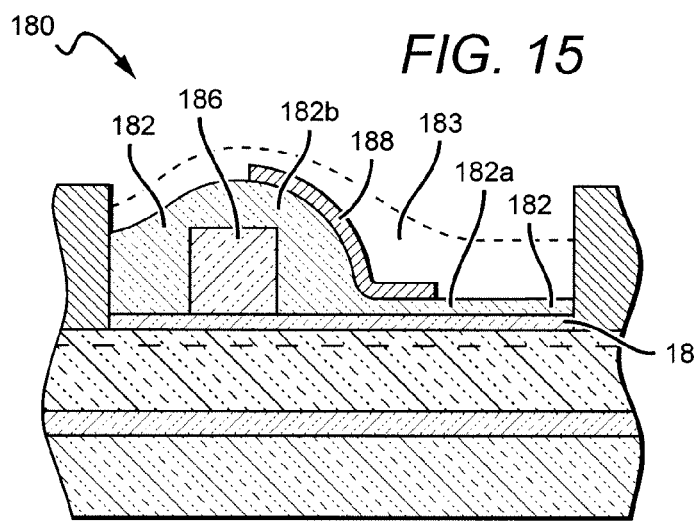
FIG. 15 is a cross-sectional view of another embodiment of a transistor according to the present invention.

In some embodiments, the first spacer layer and second spacer layer can be combined into a single spacer layer which has uneven thickness. FIG. 15 shows another embodiment of a transistor 180 according to the present invention. The transistor 180 can include an uneven spacer layer 182, which can include a thin portion 182a and a thick portion 182b. The thin portion 182a can have a thickness similar to or the same as the second spacer layer 132 from FIG. 10, while the thick portion 182b can have a thickness similar to or the same as the first spacer layer 131 from FIG. 10. The thin portion 182a can separate a field plate 188 from a barrier layer 18, while the thick portion 182b can separate the field plate 188 from a gate 186. Such embodiments can generate the advantages of having a field plate near the active semiconductor layers, such as reducing the drain bias dependence which can increase linearity, while avoiding or reducing the complications of the field plate being too near the gate (e.g., a reduction in the breakdown voltage of the device). The section of the thin portion 182 not covered by the field plate 188 can then optionally be covered by a second spacer layer 183, which can prevent trapping. In the embodiment shown, the second spacer layer 183 can be deposited over the entire length between the source and drain for ease of manufacturing.

In an alternative embodiment to FIG. 15, the spacer layer 182 is deposited with thicker portions adjacent the drain and the gate, with a thinner portion forming a "valley" between the two thicker portions. This can reduce the need for an additional spacer layer. In one such embodiment, a field plate can cover the entire thinner portion or valley between the two thicker portions.

Figure 16:
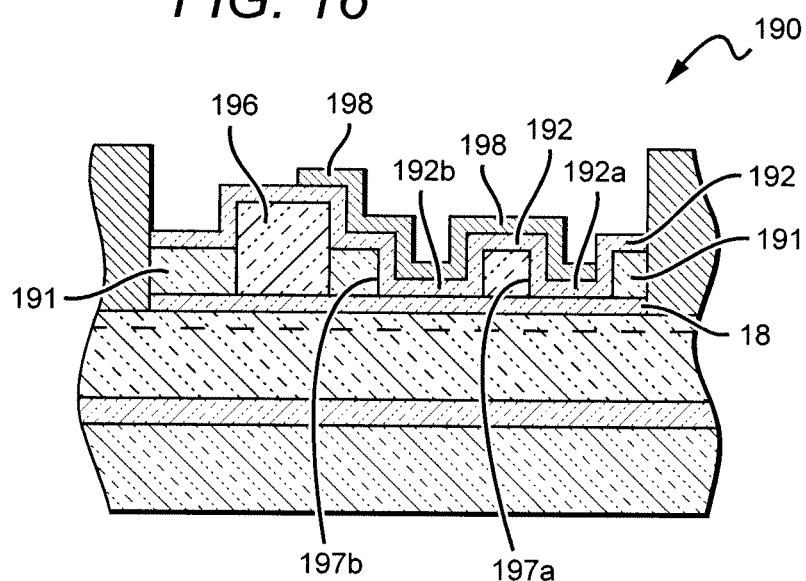
FIG. 16 is a cross-sectional view of another embodiment of a transistor according to the present invention.

Some embodiments can include a spacer layer that is shaped to define more than one aperture. FIG. 16 shows another embodiment of a transistor 190 according to the present invention. The transistor 190 includes a first spacer layer 191 which is shaped to define two apertures 197a, 197b. Both apertures 197a, 197b can be at least partially filled by another spacer layer. In the embodiment shown, both apertures 197a, 197b are filled by a second spacer layer 192, which can be similar to or the same as the second spacer layer 132 from FIG. 10 in many characteristics including material and thickness. In another embodiment, separate spacer layers partially fill each aperture. In one embodiment, the portion of the spacer layer 192b in the aperture 197b nearer the gate 196 can be thicker than the portion of the spacer layer 192a in the aperture 197a further from the gate 196. In one such embodiment, the thickness 192a can be approximately 100 Å to 800 Å or approximately 400 Å, while the thickness 192b can be approximately 500 Å to 1500 Å or approximately 1000 Å. In the embodiment shown, a field plate 198 can at least partially fills both apertures 197a, 197b. In other embodiments, separate field plates can fill separate apertures.

Figure 17:
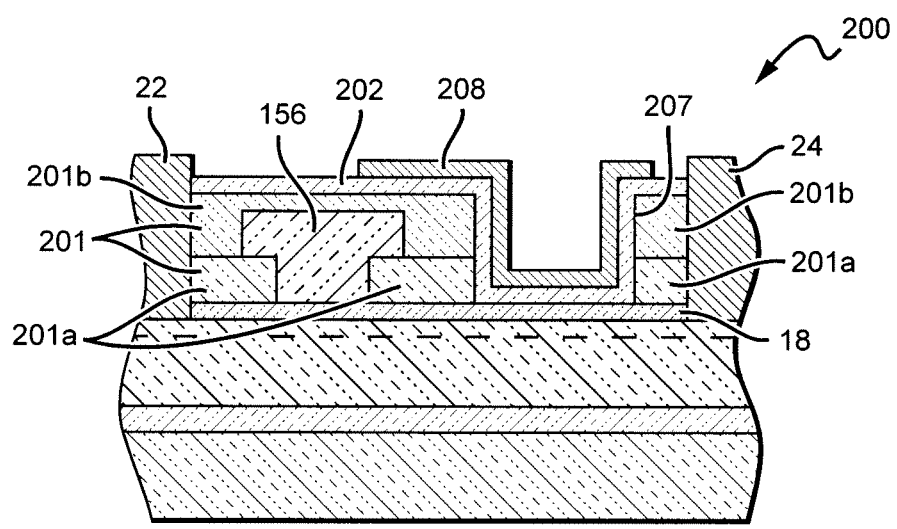
FIG. 17 is a cross-sectional view of another embodiment of a transistor according to the present invention.

FIG. 17 shows an embodiment of a transistor 200 according to the present invention that is similar in many respects to the transistor 150 in FIG. 12. In the FIG. 17 embodiment, both a first section 201a and second section 201b are deposited over the transistor from source 22 to drain 24. In this embodiment, both the first and second sections 201a, 201b can be etched to form an aperture 207 in which a spacer layer 202 and field plate 208 can be deposited. Because the field plate 208 can extend onto the top of the section 201b, it can be separated from the barrier layer 18 by a larger distance, which can reduce the field effect on the semiconductor layers and reduce trapping. As with all of the FIGS. 10-16 embodiments, the transistor 200 can include an additional spacer layer over the field plate 208 and/or include an additional field plate, such as in a configuration similar to that of FIG. 13.

The transistor 200 can be manufactured using many different methods. In one method, the first section 201a of the first spacer layer 201 is grown or deposited on the barrier layer 18. The first section 201a can be etched and the gate 156 can be deposited on the barrier layer 18. The metal forming the gate 156 can be patterned to extend across the first section 201a so as to form a T-shaped or gamma-shaped gate. The second section 201b can then be deposited or grown over the length of the transistor 200 between the source 22 and drain 24, and can cover the gate 156. Alternatively, the second section 201b can be deposited selectively, such as over the gate 156, instead of over the entire length of the transistor 200. This alternate method can produce a transistor similar to the transistor 150 from FIG. 12. In the FIG. 17 embodiment, the first and second sections 201a, 201b of the first spacer layer 201 can be etched to form an aperture 207, which can expose the barrier layer 18. The second spacer layer can then be deposited, for example over the entire length of the transistor 200 between the source 22 and the drain 24, such that the second spacer layer can cover at least the bottom of the aperture 207. A field plate 208 can then be deposited at least partially within the aperture 207. This is only one manufacturing method, and many other methods are possible. Some manufacturing methods which can be used to form devices according to the present invention are described in U.S. Pat. No. 7,812,369.

Any of the gate/field plate arrangements discussed in the present application, including those shown in FIGS. 10-17, can be interchanged with one another. For example, the field plate 148 in FIG. 11 could be substituted for the field plate 138 in FIG. 10, and such a device could have the benefits derived from maintaining a gap between the gate and field plate edge without sacrificing the benefits of the other aspects of the FIG. 10 embodiment (e.g., the benefit of the field plate being near the barrier layer). Single field plate embodiments described above could also include multiple field plates, including but not limited to arrangements discussed with regard to FIG. 13 and in the commonly assigned U.S. Pub. Nos. 2005/0253168 and 2006/0202272. Any of the FIGS. 10-17 embodiments could contain two or more and/or multiple apertures, as shown in FIG. 16. Mutually exclusive elements in any two of the above embodiments can be substituted for one another (e.g., a T-shaped gate substituted for a rectangular gate), and non-mutually exclusive elements can be added to an embodiment (e.g., a second aperture added to any of FIGS. 10-17). These represent only a few variations, and in embodiments of the present invention, as many different variations are possible.

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; and U.S. Pat. Pub. No. 2012/0194276 to Fisher and entitled "Low Noise Amplifiers Including Group III Nitride Based High Electron Mobility Transistors."

It is understood that the above arrangements can be applied to other transistors beyond HEMTs, including MESFETs and Metal Oxide Semiconductor Heterostructure Field Effect Transistor (MOSHFET), whether these transistors are single-gate transistors with one or more field plates, discrete dual-gate transistors, or part of a larger structure. The arrangements can also be applied to microwave and millimeter-wave power amplifiers for communication, instrumentation, military applications and so forth, including but not limited to monolithic microwave integrated circuits (MMICs).

Although the present invention has been described in considerable detail with reference to certain preferred configurations thereof, other versions are possible. The buried field plate and gate arrangement can be used in many different devices. The field plates and gates can also have many different shapes and can be connected to the source contact in many different ways. Accordingly, the spirit and scope of the invention should not be limited to the preferred versions of the invention described above.

We claim:

1. A transistor, comprising:
a plurality of semiconductor layers on a substrate;
a source and a drain on at least one of said semiconductor layers;
a gate between said source and drain;
a field plate on said plurality of semiconductor layers; and
a spacer layer shaped to define an aperture wherein said field plate is at least partially within said aperture, said spacer layer separating said field plate from said gate and from said plurality of semiconductor layers, said field plate separated from said plurality of semiconductor layers by a first distance;
wherein said first distance is approximately 50 Å-1500 Å and is smaller than a shortest distance between said field plate and said gate.

2. The transistor of claim 1, wherein at least a portion of said spacer layer is directly between said plurality of semiconductor layers and said field plate.

3. The transistor of claim 2, wherein said portion of said spacer layer is less than or equal to about 1500 Å thick.

4. The transistor of claim 2, wherein said portion of said spacer layer is approximately 100 Å to 800 Å thick.

5. The transistor of claim 1, wherein at least a portion of said spacer layer is directly between said field plate and said plurality of semiconductor layers.

6. The transistor of claim 1, wherein said field plate covers a bottom of said aperture.

7. The transistor of claim 1, wherein said field plate is separated from said gate by a second spacer layer.

8. The transistor of claim 1, wherein said field plate is connected to said source.

9. The transistor of claim 1, wherein said gate comprises one or more overhangs.

10. The transistor of claim 9, wherein a second spacer layer separates at least one of said overhangs from said semiconductor layers; and
wherein a third spacer layer separates said field plate from said gate.

11. The transistor of claim 1, wherein said field plate is separated from a nearest edge of said gate by a gap with a length $L_{gf}$.

12. The transistor of claim 1, wherein at least part of said field plate is recessed below a top surface of said plurality of semiconductor layers.

13. The transistor of claim 1, where said field plate improves the linearity of said transistor.

14. The transistor of claim 1, wherein a thickness of said spacer layer within said aperture is less than a thickness of said spacer layer outside said aperture.

15. The transistor of claim 1, wherein said first distance is approximately 100 Å-800 Å.

16. The transistor of claim 1, wherein said first distance is approximately 300 Å-600 Å.

17. The transistor of claim 1, wherein said first distance is approximately 400 Å.

18. A transistor, comprising:
a plurality of semiconductor layers on a substrate;
a source and a drain on at least one of said semiconductor layers;
a gate between said source and drain;
a first spacer layer on said semiconductor layers, wherein said first spacer layer is shaped to define an aperture, wherein said aperture is at least partially defined by a portion of said plurality of semiconductor layers;
a second spacer layer comprising at least a portion within said aperture; and a field plate at least partially within said aperture and on said portion of said second spacer layer.

19. The transistor of claim 18, wherein at least a portion of said second spacer layer is directly between said field plate and said exposed portion of said plurality of semiconductor layers.

20. The transistor of claim 18, wherein said field plate is separated from said semiconductor layers by a non-zero distance of about 1500 Å or less.

21. The transistor of claim 18, wherein said field plate is over said exposed portion of said plurality of semiconductor layers.

22. The transistor of claim 18, wherein the length of said aperture is larger than the length of said gate.

23. The transistor of claim 18, wherein said first spacer layer is shaped to define a second aperture.

24. The transistor of claim 18, wherein said second spacer layer is on at least a portion of a top surface of said first spacer layer.

25. The transistor of claim 18, wherein said second spacer layer is on said portion of said plurality of semiconductor layers exposed by said aperture.

26. A transistor, comprising:
a plurality of semiconductor layers on a substrate;
a source and a drain on at least one of said semiconductor layers;
a gate between said source and drain;
a spacer layer on said plurality of semiconductor layers and over said gate;
a first field plate separated from said plurality of semiconductor layers by said spacer layer;
wherein a minimum thickness of said spacer layer separating said first field plate from said plurality of semiconductor layers is less than a thickness of said spacer layer over said gate, wherein said minimum thickness of said spacer layer separating said first field plate from said plurality of semiconductor layers is approximately 50 Å-1500 Å and said thickness of said spacer layer over said gate is approximately 100 Å-2000 Å.

27. The transistor of claim 26, wherein said minimum thickness of said spacer layer separating said first field plate from said plurality of semiconductor layers is between about 100 Å and about 800 Å.

28. The transistor of claim 26, wherein said minimum thickness of said spacer layer separating said first field plate from said plurality of semiconductor layers is between about 300 Å and about 600 Å.

29. The transistor of claim 26, wherein said first field plate overlaps said gate.

30. The transistor of claim 26, further comprising a second field plate over said first field plate.

31. The transistor of claim 26, wherein said spacer layer is shaped to define an aperture; and
wherein said minimum thickness of said spacer layer separating said first field plate from said plurality of semiconductor layers is at a bottom of said aperture.

32. The transistor of claim 26, wherein said minimum thickness of said spacer layer separating said first field plate from said plurality of semiconductor layers is directly between said first field plate and said plurality of semiconductor layers.

33. The transistor of claim 26, wherein said thickness of said spacer layer over said gate is a minimum thickness.

* * * * *